(12) United States Patent
Tiwary et al.

(10) Patent No.: US 8,341,572 B1
(45) Date of Patent: Dec. 25, 2012

(54) METHODS AND APPARATUS FOR WAVEFORM BASED VARIATIONAL STATIC TIMING ANALYSIS

(75) Inventors: Saurabh K. Tiwary, Berkeley, CA (US); Joel R. Phillips, Oakland, CA (US); Igor Keller, Pleasanton, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 264 days.

(21) Appl. No.: 12/331,130

(22) Filed: Dec. 9, 2008

Related U.S. Application Data

(60) Provisional application No. 61/044,464, filed on Apr. 11, 2008.

(51) Int. Cl.
*G06F 9/455* (2006.01)
*G06F 17/50* (2006.01)

(52) U.S. Cl. .......... 716/108; 716/51; 716/105; 716/113

(58) Field of Classification Search .................. 716/108, 716/113, 105, 51
See application file for complete search history.

(56) References Cited

U.S. PATENT DOCUMENTS

| | | | |
|---|---|---|---|
| 6,349,272 B1 * | 2/2002 | Phillips | 703/2 |
| 6,457,159 B1 | 9/2002 | Yalcin et al. | |
| 6,711,598 B1 * | 3/2004 | Pare et al. | 708/300 |
| 7,239,997 B2 | 7/2007 | Yonezawa | |
| 7,425,844 B1 * | 9/2008 | Chung et al. | 326/68 |
| 7,474,999 B2 | 1/2009 | Scheffer | |
| 7,644,378 B2 | 1/2010 | Wang et al. | |
| 7,747,972 B2 | 6/2010 | Mirbeth et al. | |
| 7,788,617 B2 | 8/2010 | Bhanji et al. | |
| 7,793,244 B2 | 9/2010 | Kimata et al. | |
| 7,814,448 B2 | 10/2010 | Abbaspour et al. | |
| 7,882,471 B1 | 2/2011 | Kariat et al. | |
| 7,930,665 B2 | 4/2011 | Ichinose | |
| 7,937,256 B2 | 5/2011 | Tseng et al. | |
| 2002/0143517 A1 | 10/2002 | Kobayashi et al. | |
| 2002/0183990 A1 * | 12/2002 | Wasynczuk et al. | 703/2 |
| 2004/0002844 A1 | 1/2004 | Jess et al. | |
| 2005/0021319 A1 * | 1/2005 | Li et al. | 703/2 |
| 2005/0096888 A1 * | 5/2005 | Ismail | 703/2 |
| 2008/0244487 A1 | 10/2008 | Nitta et al. | |

OTHER PUBLICATIONS

Tutuianu et al., "Nonlinear Driver Models for Timing and Noise Analysis," IEEE Trans on CAD of ICs & Systems, vol. 23, No. 1, Dec. 2004, pp. 1510-1521.
Croix et al., "Blade and Razor: Cell and Interconnect Delay Analysis Using Current-Based Models," DAC 2003, pp. 386-389.
Fatemi et al., "A Current-based Method for Short Circuit Power Calculation under Noisy Input Waveforms", 2007 IEEE, 6 pages.

(Continued)

*Primary Examiner* — Thuan Do
*Assistant Examiner* — Brian Ngo
(74) *Attorney, Agent, or Firm* — Alford Law Group, Inc.; William E. Alford

(57) ABSTRACT

A system and method are disclosed for waveform based variational static timing analysis. A circuit is divided into its linear circuit parts and non-linear circuit parts and modeled together, by a combination of linear modeling techniques, into linear equations that may be represented by matrices. The linear equations in matrix form may be readily solved by a computer such that an input waveform to an input pin of the circuit can be sequentially "pushed" through the various interconnects and logic networks of the circuit to an output pin. Output voltage waveforms are obtained at each stage of the waveform pushing and may be used to perform static timing analysis.

19 Claims, 14 Drawing Sheets

OTHER PUBLICATIONS

Hashimoto et al., "Equivalent Waveform Propagation for Static Timing Analysis," IEEE Tran. on CAD of ICs & Systems, vol. 23, No. 4, Apr. 2004, pp. 498-508.

Kim et al., "Electrical-Logic Simulation and Its Applications," IEEE Trans. on CAD, vol. 8, No. 1, Jan. 1989, pp. 8-22.

Nazarian et al., "Sensitivity-Based Gate Delay Propagation in Static Timing Analysis," Proc. 6th Int'l Symposium on Quality Electronic Design, IEEE 2005, 6 pages.

Qian et al., "Modeling the "Effective Capacitance" for the RC Interconnect of CMOS Gates," IEEE Trans. on CAD of ICs & Systems, vol. 13, No. 12, Dec. 1994, pp. 1526-1535.

Vidigal et al., "CINNAMON: Coupled Integration and Nodal Analysis of MOS Networks," 23rd Design Automation Conference, 1986 IEEE, pp. 179-185.

Wang et al., "ADAMIN: Automated, Accurate Macromodeling of Digital Aggressors for Power and Ground Supply Noise Prediction," IEEE Trans. on CAD of ICs & Systems, vol. 24, No. 1, Jan. 2005, pp. 56-64.

Odabasioglu et al., "PRIMA: Passive Reduced-Order Interconnect Macromodeling Algorithm," IEEE Trans. on CAD of ICs & Systems, vol. 17, No. 8, Aug. 1998, pp. 645-654.

Keller et al., "A robust cell-level crosstalk delay change analysis," 2004 IEEE, pp. 147-154.

Fatemi et al., "Statistical Logic Cell Delay Analysis Using a Current-based Model," DAC 2006, 5 pages.

\* cited by examiner

METHODS AND APPARATUS FOR WAVEFORM BASED VARIATIONAL STATIC TIMING ANALYSIS

CROSS REFERENCE TO RELATED APPLICATIONS

This non-provisional United States (U.S.) patent application claims the benefit of provisional U.S. Patent Application No. 61/044,464 filed on Apr. 11, 2008 by inventors Saurabh Tiwary et al., entitled WAVEFORM BASED VARIATIONAL STATIC TIMING ANALYSIS, and is incorporated herein in its entirety by reference.

FIELD

The embodiments of the invention generally relate to static timing analysis of integrated circuits with consideration of semiconductor process and environmental variations.

BACKGROUND

Electronic Design Automation (EDA) is used extensively in the design of integrated circuits. An electronic circuit under design is evaluated using models of devices and interconnections between the devices. A simulation using these models is then run to test the performance of the circuit.

Timing and signal integrity are ever increasingly important issues in integrated circuit design, particularly due to drastic scaling down rate of layout geometries as well as the increase in operating frequency. Static Timing Analysis (STA) method is used for verifying and analyzing the timing constraints for the circuit.

Variations in semiconductor processing of an integrated circuit can cause changes in its performance and yield. In nanometer technologies, the variations have become significant and can not be ignored. The process variations are variations in electric characteristics of transistors due to the upstream steps of producing the ICs on a wafer, or the downstream steps of sealing the IC chips produced in the upstream steps in various kinds of packages. The performance of a chip is also affected by environmental variations, such as variations in temperature or supply voltage. The fluctuations in production conditions also affect the shapes and physical conditions of circuit elements. Therefore, characteristic variations of the semiconductor integrated circuits are inevitable.

In conventional approaches, STA is performed at the transistor or cell level using libraries of information and characteristics such as delay and slew. Most of the conventional approaches are "vectorless" and avoid the expense of dynamic simulation (e.g., SPICE simulation) to estimate timing. Due to the phenomenal advancement in drawing extremely small transistor dimensions and the push for aggressive design styles to achieve better chip functionality, the voltage waveforms, commonly observed in modern chips may differ significantly from the assumptions of STA. Conventional static timing analysis tool are often unable to capture non-idealities in the waveforms, for example, overshoots, spikes, ringing, etc.

Additionally, it is often difficult to exhaustively characterize the cells for all possible loading conditions. Thus, approximate equivalent capacitance models are formed for interconnects to generate look-up table values for the gate models. Due to these approximations and the intrinsic limitations of the models, the generated output waveforms do not match the real circuit behavior. The problem is more severe in the case of non-linear loading conditions, such as when other gates are coupled to the output of the driver as fan-out gates. The problem is further exacerbated due to large changes in transistor and interconnects characteristics in the presence of process variations.

In summary, different kinds of variations have an effect on timing. It is desirable to consider semiconductor processing variations in performing a static timing analysis of an integrated circuit. Therefore, there is a need for a system and process to provide a STA tool for more accurate and fast calculations of timing analysis using distorted (noisy) output waveforms through gates and interconnects.

BRIEF SUMMARY OF THE INVENTION

The embodiments of the invention are best summarized by the claims that follow below.

Briefly however, a system and method are disclosed for waveform based variational static timing analysis. A circuit is divided into its linear circuit parts and non-linear circuit parts and modeled together, by a combination of linear and non-linear modeling techniques, into linear equations that may be represented by matrices. The linear equations in matrix form may be readily solved by a computer such that a representation of an input waveform to an input pin of the circuit can be sequentially pushed through the various interconnects and logic networks of the circuit to an output pin. Representations of output voltage waveforms are obtained at each stage of the waveform pushing and may be used to perform static timing analysis.

BRIEF DESCRIPTIONS OF THE DRAWINGS

FIG. 1D is a diagram of an integrated circuit having input and output pins with logic gates and interconnect there-between.

DETAILED DESCRIPTION

Figure 1A:
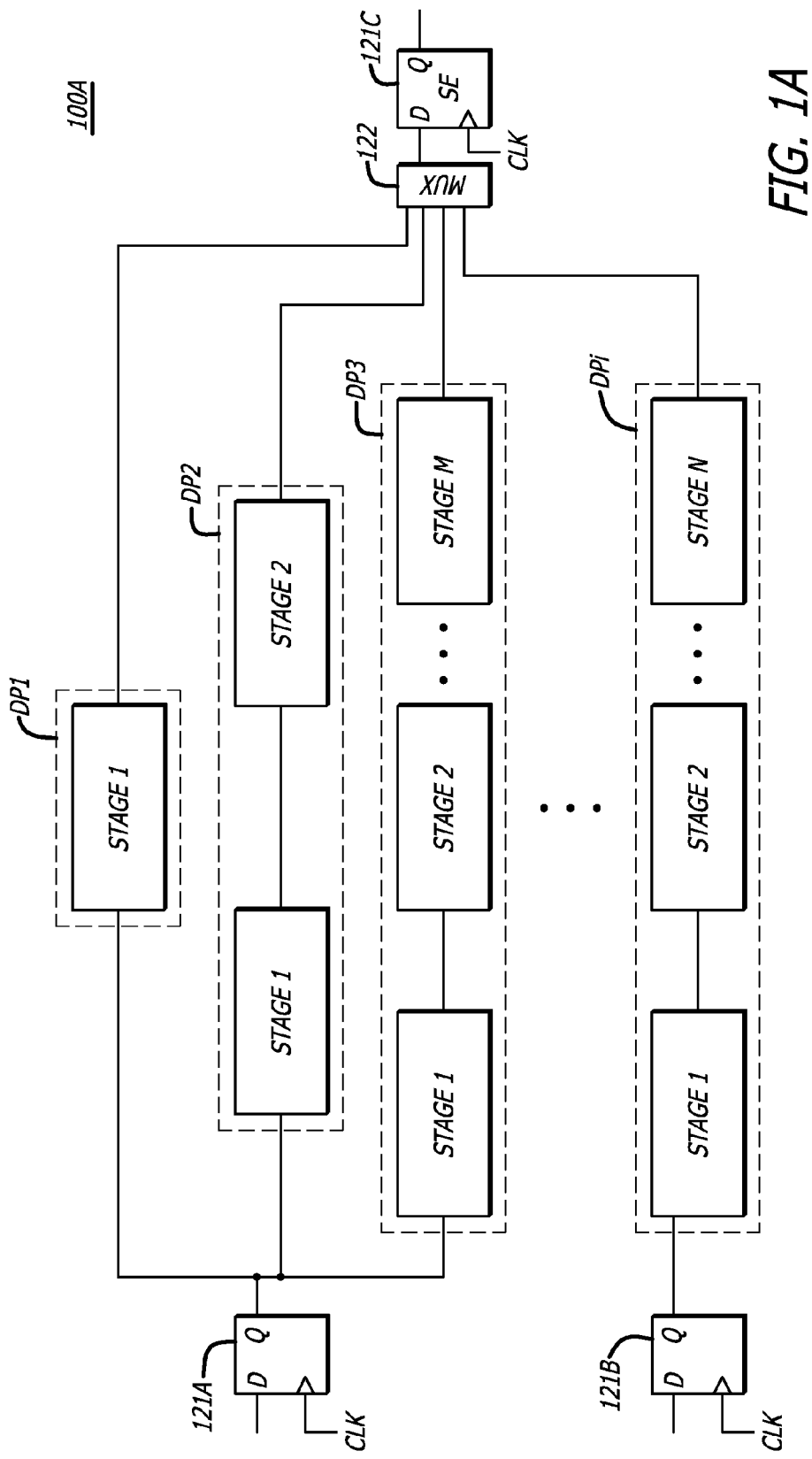
FIG. 1A is a block diagram of a portion of an exemplary netlist of an integrated circuit with stages of standard cells along delay paths between flip flops.

In the following detailed description of the embodiments of the invention, numerous specific details are set forth in order to provide a thorough understanding of the embodiments of the invention. However, the embodiments of the invention may be practiced without these specific details. In other instances well known methods, procedures, components, and circuits have not been described in detail so as not to unnecessarily obscure aspects of the embodiments of the invention.
Introduction In general, static timing analysis (STA) involves identifying timing paths within the design, calculating delay of each path, and finally comparing the path delay against timing constraints specified in the design. The basic idea of STA is based on representation of logic function by Boolean variables (variables that can take on values of logical zero and one). In traditional STA methodologies, logic levels and corresponding valid transitions between them are propagated from one stage (gate) to another. A voltage transition at a particular circuit node has the topology of a saturated ramp. However, conventional STA simplifies the transition by approximating it with a linear saturated ramp. Accordingly, the signal transitions may be modeled using two parameters of transition, arrival time (AT) and slew.

In the framework of STA, these two parameters of transition are computed at output of each stage and then propagated through the circuit in a topological order. The calculation of arrival time of output signals at the output of each stage is determined by using the timing delay in the stage itself (stage delay) and the arrival times of the input signals at the input of the stage. The stage delay and the output slew are computed during the delay calculation step of STA. A response (transition) at the stage's outputs is computed using (often simplified) gate and driven interconnect models. The output slew and the overall timing delay are then computed from this response. Earlier table-lookup delay models were motivated by this abstraction, where these two parameters would be tabulated as a function of input slew and output load capacitance. These models can have significant inaccuracies as transitions in modern designs are quite different from a linear ramp. Also, seemingly insignificant details of the waveform can affect the delay of next stages by appreciable amounts. Moreover, interconnects are often very resistive which means that they can hardly be modeled by a single capacitance. Hence, the major aspects of the timing analysis problem are modeling the gate behavior in presence of non-ideal waveforms, bias and loading conditions and efficiently simulating linear interconnect networks.

The most successful amongst the gate models have been the current-source models. They represent the output current and impedance of a logic gate as a function of input voltage in tabular form. As for the linear interconnect network, there are fairly mature techniques for applying model order reduction ideas to solve the resulting large linear circuit equations efficiently. Together, this strategy results in a substantial improvement over table-lookup based strategies, but there are still some drawbacks to this approach. Once the models for the gates and the interconnect network are generated, they are simulated using time-step integration techniques which can lead to long analysis time. In the presence of large variations in manufacturing process, the problem of extracting these models becomes more complicated as one has to extract the model information not only for the nominal condition, but also for different settings of process parameters resulting in huge model sizes. Finally, with most static timing analyzers (static timers), the more detailed waveform information is discarded after a single circuit stage with only the delay/slew numbers being retained to propagate through additional circuit stages.

Significant progress has been made in addressing these problems resulting from the underlying assumptions and approximations of transition STA. The simplest, straightforward and most accurate solution for analyzing timing of a circuit is to perform a full SPICE (Simulation Program with Integrated Circuit Emphasis) analysis of the complete circuit. However, SPICE and fast SPICE simulators, though accurate, are still slow when simulating millions of gates that are now routinely found in digital integrated circuit chips. Therefore, it is computationally impractical to perform SPICE level simulations of a complete digital integrated circuit chip that has a large number of circuit elements.

The alternative approach is a fine grained modeling of the digital gates. Instead of characterizing a waveform with a delay and a slew number, waveforms are represented using a host of different values like overshoot, spikes, decay number (e.g., time taken to go from 10% to 1% of a high or low logic value), etc., apart from the regular metrics of delay and slew (e.g., time taken to go from 10% of Vdd to 90% of Vdd). However, these methods are ad hoc, lacking a methodical strategy for characterization of waveforms within integrated circuits.

To improve simulation time in simulating complete integrated circuit, models of the input and output interfaces of digital gates may be used with model order reduction (MOR) techniques to efficiently simulate large, linear interconnected networks. Accuracy in the simulation of the complete integrated circuit can be improved if appropriate modeling algorithms are utilized.

Referring now to FIG. 1A, a block diagram of a portion of an exemplary netlist for an integrated circuit design 100A is illustrated. The block diagram of the portion of the integrated circuit design 100A includes a plurality of delay paths DP1-DPi from D flip-flops/latches/registers 121A-121B multiplexed into a D flip-flop/latch/register 121C by a multiplexer 122. The embodiments of the invention may be used to statically compute the timing delays through the delay paths between the D flip-flops/latches/registers 121A-121B and the D flip-flop/latch/register 121C.

The delay paths DP1-DPi may have various stages of different standard cells of logic gates. A first delay path DP1 includes a single stage, Stage 1. A second delay path DP2 includes two stages, Stage1 and Stage2. A third delay path DP3 includes M stages, Stage1 through StageM. An $i^{th}$ delay path Dpi includes N stages, Stage1 through StageN.

Figure 1B:
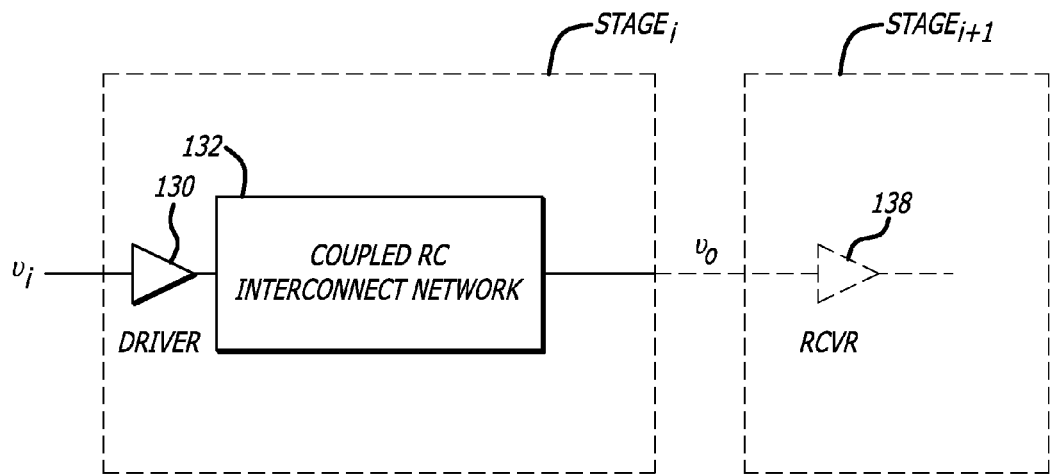
FIG. 1B illustrates an exemplary pair of stages coupled together.

FIG. 1B illustrates an exemplary pair of stages of standard cells, Stage(i) and Stage(i+1). Stage(i) may be modeled by a driver 130 driving a coupled RC interconnect network 132 and a load impedance of a receiver 138. A voltage source Vi having a waveform generated by a prior stage is coupled to the input of driver 130. In response to the input voltage Vi and the coupled RC interconnect network 132, the driver 130 generates an output voltage Vo at the one or more outputs of the stage(i). While the description herein may describe a model with a single output, it may be readily duplicated for a standard cell or logic gate with a plurality of outputs.

Figure 1C:
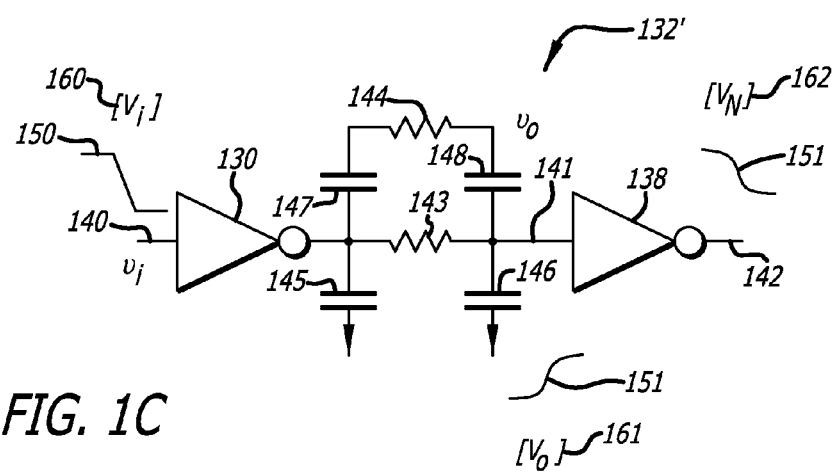
FIG. 1C is a schematic diagram of an exemplary stage of a standard cell in a netlist with waveforms being pushed through the circuit.

Referring now to FIG. 1C, a schematic diagram of a circuit representative of an exemplary pair of stages coupled together to illustrate the concept of waveform pushing. A first stage of the circuit includes the driver 130 and the RC interconnect network 132'. A second stage of the circuit includes a receiver 138. The RC interconnect network 132' coupled between the driver 130 and the receiver 138 includes one or more resistors 143-144 and one or more capacitors 145-148 coupled together as shown.

An input waveform 150 $v_{in}$ is coupled into the driver 130 at node or net 140. The output driver and the RC interconnect network 132' form an output waveform 151 on node or net 141 that is coupled into the input of the receiver 138. The receiver 138, in response to the waveform 151, may generate an output waveform 152 on an output node or net 142.

Waveform Based Variational Static Timing Analysis

The embodiments of the invention include a system and method for waveform based variational static timing analysis (WAVSTAN) of an electronic circuit. The system and method embodiments of the invention provide an output voltage that behaves as a function of the input voltage with variations induced distortions, using available characterized cell library models. In contrast, other approaches may try to approximate the output voltage timing information as a function of the input voltage timing information. The method of waveform based variational static timing analysis (WAVSTAN) conveys the actual shape of the output waveform voltage, such as waveforms 150-152, rather than simply reporting the delay and slew of a circuit.

The embodiments of the invention use a waveform pushing method to simulate timing in a circuit. In this approach, a given input waveform is sequentially pushed through the various interconnects and logic networks of a circuit until it reaches an output. Complete waveforms are solved at each stage of waveform pushing. With the embodiments of the invention, the actual shape of the waveform with respect to time is moved around across the gates and interconnects, while in conventional STA, only numbers related to certain key waveform characteristics (e.g., delay, rise/fall-time etc.) are moved around across the gates and interconnects. The pushing of complete waveforms through a circuit design during simulation timing can provide accurate resultant behavior of the circuit design under predetermined test conditions.

For example, consider the schematic of the circuit illustrated in FIG. 1C. An input waveform 150 represented by a vector or matrix 160 is pushed through the driver 130 and the RC interconnect network 132' to generate the waveform 151 represented by a vector or matrix 161. Further, the waveform 151 is pushed through the receiver 138 to generate the output waveform 152 represented by a vector or matrix 162. The vectors or matrices 160-162 representing the waveforms may be simplified and/or compressed to improve the efficiency of the simulation computations.

Figure 1D:
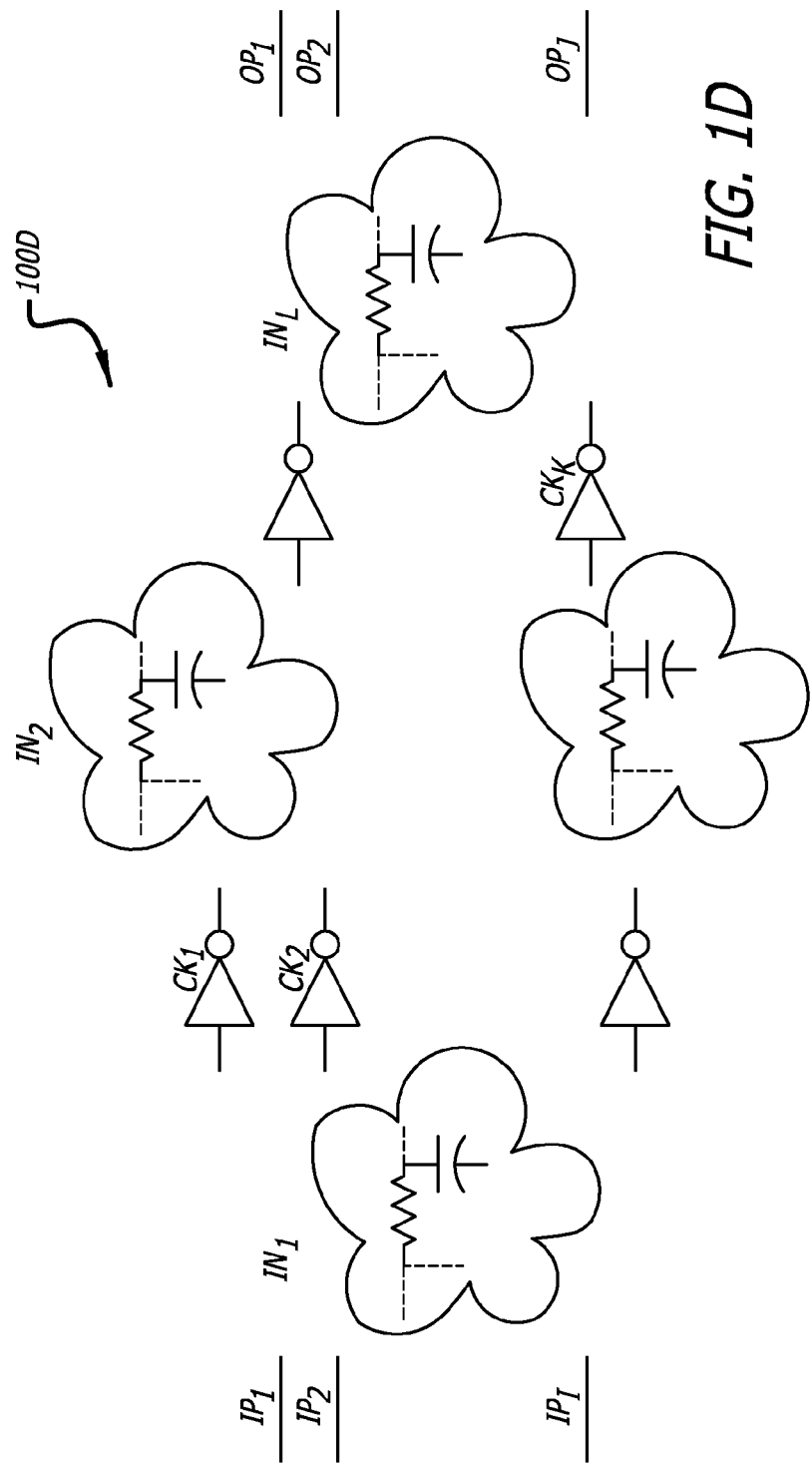

Referring now to FIG. 1D, the embodiments of the invention calculate the timing for a digital circuit under realistic excitation conditions. If a digital circuit 100D has inputs IPi for i=1, 2, ..., and outputs OPj for j=1, 2, ..., J, the waveforms at these terminals can be represented as wv(IPi) or wv(OPj). The circuit has $C_k$ circuit blocks for k=1, 2, ..., K connected by interconnect networks IN1 for j=1, 2, ..., L. The characteristics (e.g. delay, rise/fall-time, overshoot, etc.) of a waveform wv(OPj) at the output OPj of a circuit can be determined as a function of a particular set of input waveforms $\{wv(IP_1), wv(IP_2), ..., wv(IP_I)\}$ to the circuit.

Generally, the static timing analysis method employed by the embodiments of the invention includes: (a) extracting or receiving a layout (netlist) of an integrated circuit, including a plurality of logic gates and transistors; (b) dividing or partitioning the layout (netlist) into sub-layouts (sub-netlists); (c) pushing an input waveform through the various interconnects and logic networks of the circuit until it reaches an output; (d) deriving output voltage waveforms from input waveforms at each stage of waveform pushing; and (e) using the output voltage waveforms to determine the timing of the integrated circuit.

Figure 2:
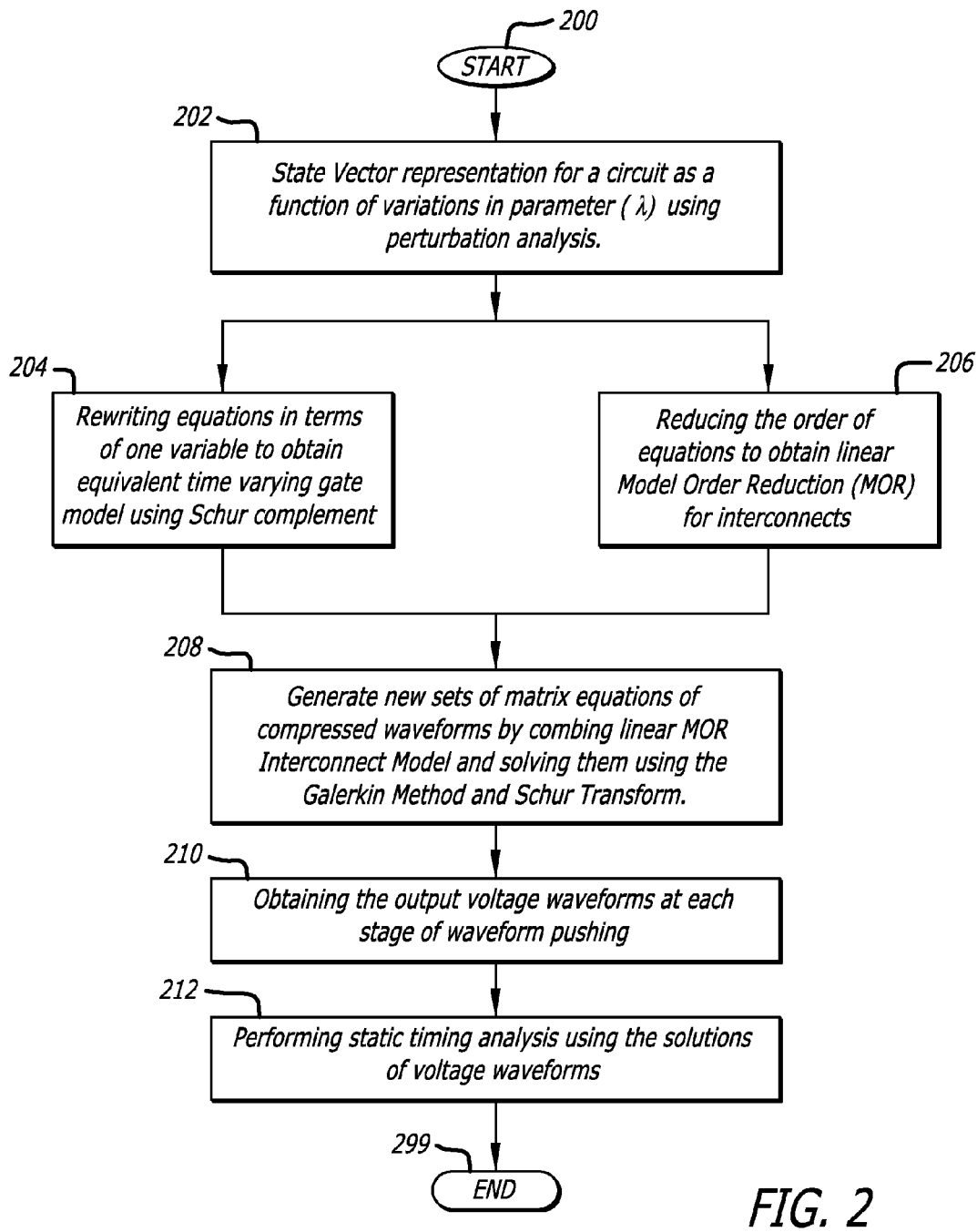
FIG. 2 is a flow chart of a method for modeling and performing static timing analysis of a circuit in accordance with one or more embodiments of the invention.

Referring now to FIG. 2, a flow chart illustrates an algorithmic method for performing waveform based variational static timing analysis (WAVSTAN) of an electronic circuit. The method starts at block 200 and goes to block 202.

At block 202, a perturbation analysis allows to pre-characterize not only the performance of a single, fixed gate instance, but the entire range of behavior of a gate topology. The perturbation analysis generates a state vector representation of a circuit as a function of variations in circuit parameters ($\lambda$). The method then goes to perform blocks 204 and 206, which may be performed in parallel.

At block 204, the logic gates are modeled. The state vector equations representing the logic gates are rewritten in terms of a single variable to obtain an equivalent time varying gate model using Schur-complements. That is, using a combination of time-varying modeling and Schur-complement manipulations, rigorous models of a logic gate with respect to I/O loading effects can be obtained.

At block 206, the interconnect networks between logic gates are modeled. The state space equations representing the interconnect network between logic gates is reduced in order to obtain a linear reduced order model. A Schur-transform based model order reduction technique may be used to accelerate the computations for the parasitic components in the compressed representation.

After the logic gates and the interconnects between the logic gates are modeled for the circuit by respective blocks 204 and 206, a waveform pushing from input to output of the circuit may begin with block 208.

At block 208, for each input/output node in the circuit a new set of matrix equations of compressed waveforms are formed by combining the linear reduced order model of interconnect with the equivalent time varying gate model. The matrix equations may then be solved using a Galerkin approximated method and a Schur transformation. The combination of waveform compression and Galerkin approximations, provide a highly compressed representation of a full waveform that can be passed through an entire integrated circuit to provide a complete circuit analysis.

At block 210, input signal waveforms are coupled to the inputs of the integrated circuit to be pushed through the stages of the integrated circuit. At each stage of waveform pushing, the output voltage waveforms are obtained from the matrix equations for each stage. The process then goes to block 212.

At block 212, a static timing analysis is then performed on the complete circuit using the solutions for the output voltage waveforms of each stage. Upon completing the determination of timing delay and output slew timing for each output, the analysis may then go to block 299 and end.

Given these general steps to the algorithmic method for performing waveform based variational static timing analysis (WAVSTAN) of an electronic circuit, a more detailed explanation of some of the steps is now provided.

Perturbation Analysis for Pre-Characterization

As mentioned previously with reference to block 202, a perturbation analysis is used to pre-characterize an entire range of behavior of a gate topology. The perturbation analysis (parameterizing) generates a state vector representation of a circuit as a function of variations in circuit or simulation parameters ($\lambda$). The circuit parameter ($\lambda$) may be any process parameter (e.g., threshold voltage, oxide thickness), transistor parameter (e.g., width, length), input waveform parameter (e.g., rise-time, fall-time, input slew), output parameter (e.g., output capacitance loading), environmental parameter (e.g., temperature, power supply voltage), or a combination thereof. The state vector is composed of voltage at the capacitive nodes and current through inductors of a circuit.

Pre-characterizing a range of behavior of a gate topology is derived by using perturbation analysis of the underlying charge-current circuit equation. Perturbation analysis is generally described in "Introduction to Perturbation Methods" by M. H. Holmes, published by Springer-Vela, New York, 1995 and "Adamin: Automated, Accurate Macromodeling of Digital Aggressors for Power and Ground Supply Noise Suppression" by Z. Wang et al, TCAD, pages 56-64, 2005. The charge-current equation used by SPICE during circuit simulation is Equation (1) having the following form:

$$\frac{dq(x,t)}{dt} + i(x,t) = 0 \qquad (1)$$

In Equation (1), charges are conserved where x is the state-vector of the system, t is time, q(x,t) is the charge of the given state at a given time, and i(x,t) is the current of the given state at the given time.

The charge current shown in Equation (1) may be rewritten into a circuit level equation as a function of small variations in some circuit parameter ($\lambda$) by dropping the 't', for sake of simplicity. Equation (1) is rewritten into Equation (2) as follows:

$$\dot{q}(x,\lambda) + i(x,\lambda) = 0 \qquad (2)$$

Equation (2) is a circuit level equation that is a function of small variations in the circuit parameter ($\lambda$). The circuit parameter ($\lambda$) may be any process parameter (e.g., threshold voltage (vth), oxide thickness (tox)), or input waveform parameter (e.g., rise-time, slope), environmental parameter (e.g., power supply voltage, temperature), or design parameter (e.g., width W of transistor, length L of transistor).

A functional representation of the equation may be obtained by using a perturbation analysis of the charge current equation (1) and the circuit equation (2). Expanding i and q around fixed $x_0$ and $\lambda_0$ and massaging terms, Equation (3), a functional representation may be obtained as follows:

$$\frac{d}{dt}\left[\frac{dq}{dx}\bigg|_{x_0}\Delta x + \frac{dq}{d\lambda}\bigg|_{\lambda_0}\Delta\lambda\right] + \frac{di}{dx}\bigg|_{x_0}\Delta x + \frac{di}{d\lambda}\bigg|_{\lambda_0}\Delta\lambda = 0 \qquad (3)$$

Equation (3) may be discretized at time points $t^n$ and $t^{n+1}$ using a simple scalar multiplication, such as the backward Euler method. With some further algebraic manipulations, a recursive relationship may be obtained for $\Delta x^{n+1}$ as a function of variations in lambda ($\Delta\lambda$) as follows in Equation (4):

$$\Delta x^{n+1} = K_x^{n+1}\Delta x^n - K_\lambda^{n+1}\Delta\lambda \qquad (4)$$

Using the equation $$\Delta x_{t^0} = \frac{\partial x}{\partial\lambda}\Delta\lambda,$$

a linear approximation of terms may be made to further simplify Equation (4) into Equation (5) as follows:

$$\Delta x^{n+1} = K_{lin}^{n+1}\Delta\lambda \qquad (5)$$

For small variations in the circuit parameter $\lambda$, the solution of Equation (5) provides the state vector $\Delta x$ for the circuit at all time points through simple scalar multiplication. Thus, once a circuit has been pre-characterized to acquire the linearly approximated constants $K_{lin}^{n+1}$ for a circuit parameter $\lambda_s$, there is no need to re-simulate the circuit to obtain output waveforms when there are small variations in the circuit parameter ($\lambda_s$). The variation in the output waveform due to small changes in the circuit parameter ($\lambda_s$) may be computed from the constants $K_{lin}^{n+1}$ by scalar multiplication.

As can be seen from the derivation of the parameterized model, the model is substantially accurate for perturbed values of parameters that are close to the nominal parameter values (modeled parameter values) for which the model was extracted. To increase the accuracy, multiple perturbation models can be generated for different values of nominal parameters. For example, the parameterized model can be generated for an input waveform with a rise time of 50 ps, 100 ps, 150 ps, etc. Depending on the rise time of the test waveform coupled to an input of a logic gate, one of these models (or a combination of these) may be used to solve the circuit equations. For example, if the test waveform has a rise time of 60 ps, the parameterized model corresponding to the 50 ps input waveform may be used to simulate the circuit behavior for the test waveform. Moreover, a weighted combination of the available models may be used to simulate the circuit behavior.

Modeling Transistors and Logic Gates with Schur Complements

As previously mentioned with respect to block 204, state vector equations representing the logic gates are rewritten in terms of a single variable to obtain an equivalent time varying gate model using Shur-complements. Computing Shur-complements is generally described in "Introduction to Linear Algebra" by L. W. Johnson et al., Addison Wesley, 2001.

Figure 4A:
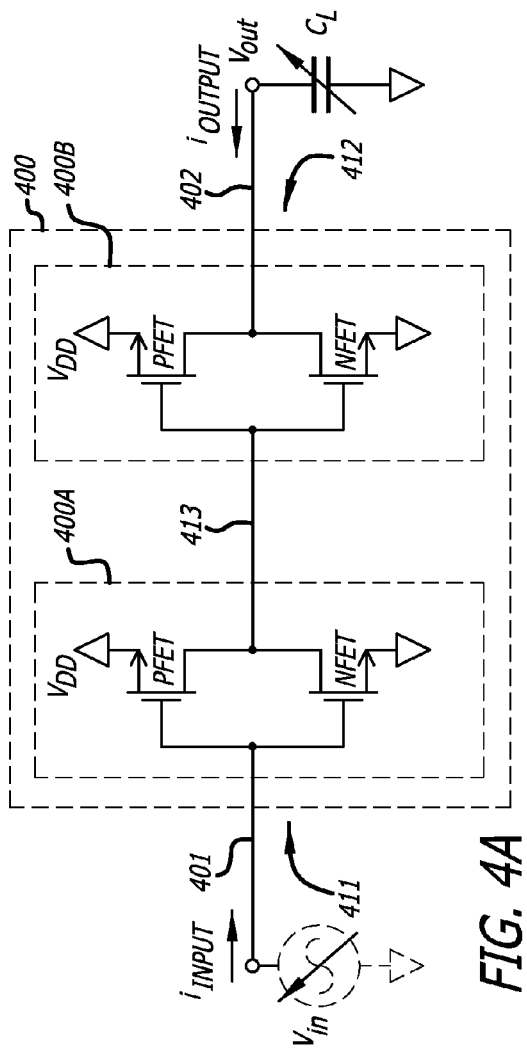
FIG. 4A illustrates a schematic diagram of an exemplary logic gate with an input and an output to be modeled by time varying Norton equivalent input and output models.
Figure 4C:
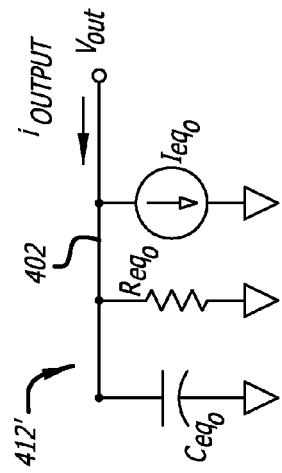
FIG. 4C illustrates a schematic diagram of a time varying Norton equivalent output model for the output of the logic gate of FIG. 4A.
Figure 4B:
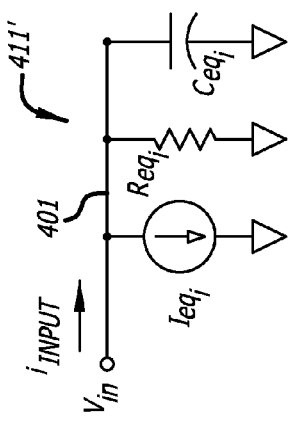
FIG. 4B illustrates a schematic diagram of a time varying Norton equivalent input model for the input of the logic gate of FIG. 4A.

Referring now to FIGS. 4A-4C, the inputs and outputs of the one or more logic gates and transistors within a circuit cell 400 of a cell library are modeled by a Norton equivalent circuit consisting of a parallel combination of a time-varying current source, time-varying conductance (resistance), and time-varying capacitance element. FIG. 4A illustrates a circuit cell 400 with one or more simple logic gates 400A-400B (e.g., an inverter or inverting buffer) having one or more inputs 401 and one or more outputs 402. For modeling each input 401 of a circuit cell/logic gate/transistor with an equivalent, the view 411 into the input is analyzed to form the model 411' illustrated in FIG. 4B. For modeling each output 402 of the circuit cell/logic gate/transistor with an equivalence, the view 412 into the output is analyzed to form the model 412' illustrated in FIG. 4C.

Using Schur complements, the input model 411' models the input of the circuit cell/logic gate/transistor gate and the output model 412' models the output of the circuit cell/logic gate/transistor gate. With a plurality of logic gates within a circuit cell, such as gates 400A-400B, there are one or more internal nodes 413. The input model 411' further models the effects of the one or more internal nodes upon the input node 401. The output model 412' may further model the effects of one or more internal nodes upon the output node 402.

The input model 411' includes a parallel combination of an input equivalent time-varying current source Ieq$_i$, an input equivalent time-varying conductance (resistance) Req$_i$, and an input equivalent time-varying capacitance Ceq$_i$ coupled together as shown. For modeling each output 402 of the logic gate/transistor with an equivalence, the view 412 into the output is analyzed to form the model 412' illustrated in FIG. 4C. The output model 412' includes a parallel combination of an output equivalent time-varying current source Ieq$_o$, an output equivalent time-varying conductance (resistance) Req$_o$, and an output equivalent time-varying capacitance Ceq$_o$ coupled together as shown.

Figure 7A:
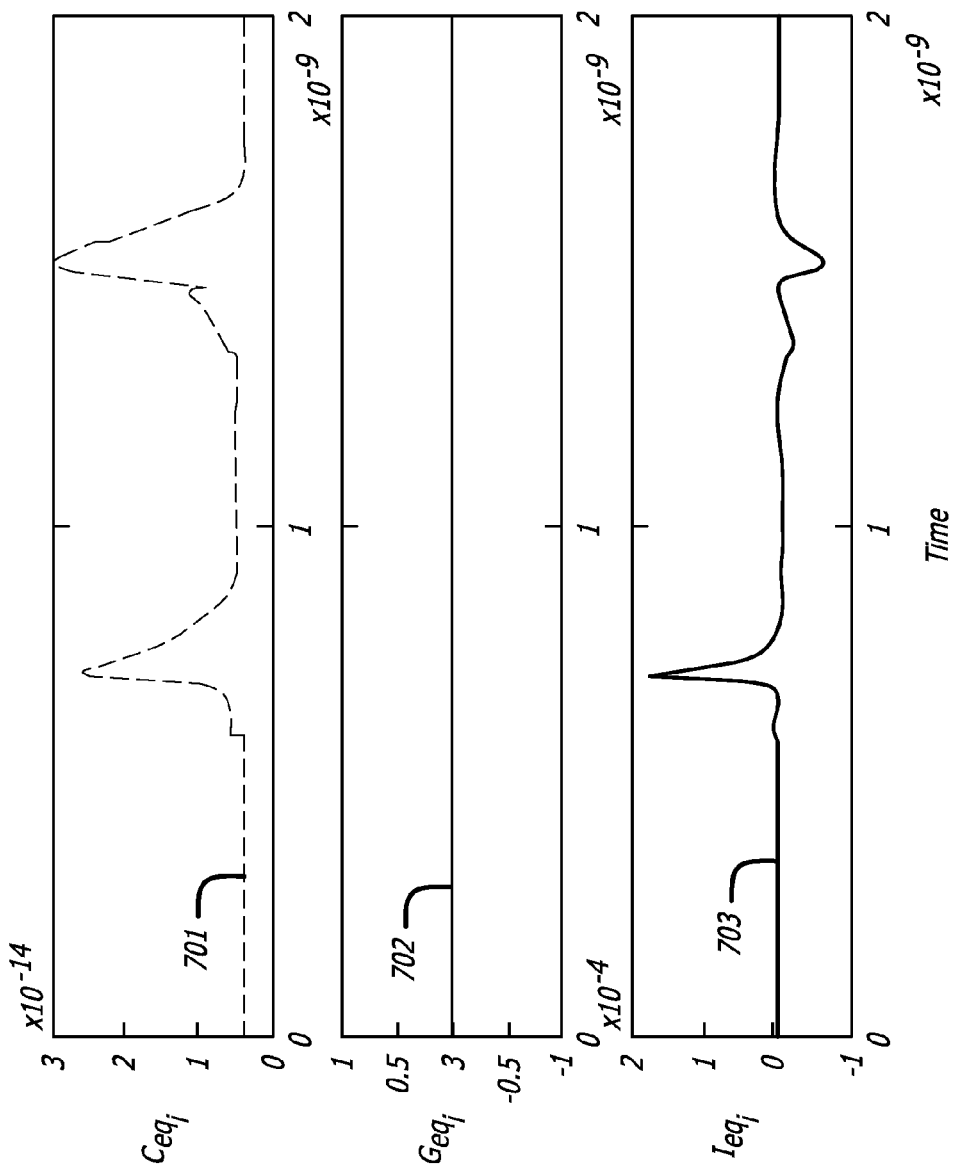
FIG. 7A illustrates waveform diagrams for time-varying linear equivalent input capacitance, conductance (resistance), and current elements.

Referring for a moment to FIG. 7A, exemplary graphs 701-703 are illustrated of time-varying linear (TVL) equivalent input components as the input voltage on the input node of a CMOS inverter changes. Plot 701 illustrates a time varying equivalent input capacitance Ceq$_i$ to model the input capacitance of an input to an inverter. As can be seen from the plot 701, input capacitance of a logic gate may vary over time. The rises to peaks in the plot 701 of the input capacitance are the result of a miller feedback capacitance. Miller multiplication results in large values of input capacitances during signal transition periods. Plot 702 illustrates a time-varying equivalent input conductance Req$_i$. As may be expected, the plot 702 illustrates a simulated constant conductance of zero (an infinite resistance to ground) for the input of a complementary metal oxide semiconductor (CMOS) inverter. Plot 703 illustrates a time varying equivalent input current source Ieq$_i$. As may be expected, plot 703 illustrates nearly zero input current leakage when the CMOS inverter is steady state and peak current levels when the state of the CMOS inverter transitions.

Figure 7B:
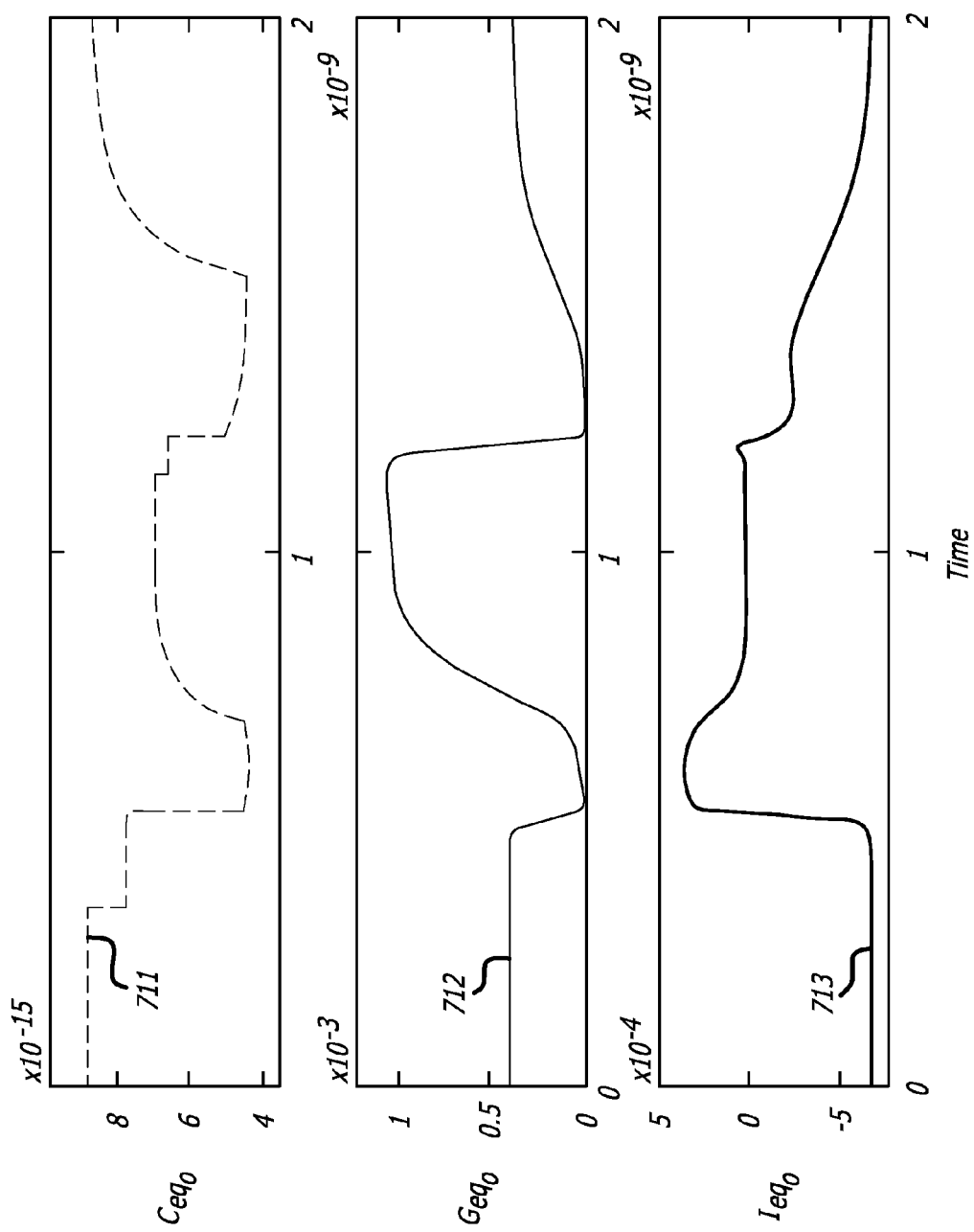
FIG. 7B illustrates waveform diagrams for time-varying linear equivalent output capacitance, conductance (resistance), and current elements.

Referring for a moment to FIG. 7B, exemplary graphs 711-713 are illustrated of time-varying linear (TLV) equivalent output components as the output voltage on the output node of the CMOS inverter changes. Plot 711 illustrates variations in the time varying equivalent output capacitance Ceq$_o$. Plot 712 illustrates variations in a time-varying equivalent output conductance Req$_o$. Plot 713 illustrates a time varying equivalent output current source Ieq$_o$. As may be seen from the plots 711-713, when the state of the CMOS inverter changes there are variations in the time-varying equivalent output current source Ieq$_o$, the time-varying equivalent output conductance (resistance) Req$_o$, and the time-varying equivalent output capacitance Ceq$_o$ until a steady state is reached.

Referring now back to FIGS. 4B-4C, the Norton equivalent components for the non linear circuit of the logic gate/transistor are obtained by computing Schur complements of an approximate linear representation of time-varying circuit equations used by SPICE during circuit simulation. The state-space equation is rewritten in terms of only one variable (the input or output node). The scalar elements in that equation automatically give the Norton equivalent circuit components. This is a first-order approximation. For each gate, an equivalent input and output model is created.

For a non-linear circuit, its approximate linear representation (charge current Equation (2)) and its equivalent input/output models for the circuit are used as starting points to compute the Shur complements.

Jacobian matrices (a matrix of all first-order partial derivatives of a vector-valued function) of the charge vector and the current vector give the capacitance (C) and conductance (G) matrices, respectively, at a particular point in the state-space ($v_o$).

$$\left.\frac{dq}{dv}\right|_{V_o} = C \ \& \ \left.\frac{di}{dv}\right|_{V_o} = G \qquad (6)$$

The Jacobian matrices obtained during SPICE simulation at each time-step are used to construct an approximation of the non-linear circuit with only linear elements. The linear circuit has the same number of nodes and voltage sources as the non-linear parent circuit. The capacitance and conductance values of the linear network are such that the resulting capacitance and conductance matrices of the linear network match that of the non-linear circuit at each time point (linearization point) in its state-space. The voltage values for the linear circuit are forced to take the same values as their corresponding nodes in the non-linear network by introducing new pseudo current sources at the different nodes.

For the linear circuit, the values of these pseudo current sources I are chosen in such a way so as to balance the resulting state-space equation, Equation (7), for input nodes is as follows:

$$C\dot{v}+Gv+I=0 \qquad (7)$$

In Equation (7), C, G, and I are respectively the capacitance matrix (C), conductance (G) matrix, and the pseudo current source matrix (I) for the input node.

The values of current, capacitance and conductance elements of the model are time varying. Thus, the values of the capacitance matrix (C), conductance (G) matrix, and the pseudo current source matrix (I) are time varying such that Equation (7) provides a different linearized approximation of the non-linear circuit at each simulated time step. At each time step, an equivalent linear network is created with the same number of nodes as the non-linear circuit, the same number of voltage sources, the same capacitance matrix (C) and conductance (G) matrix, and the extra pseudo current sources represented by the pseudo current source matrix (I) to balance out Equation (7), the state space equation for the input nodes.

Figure 4D:
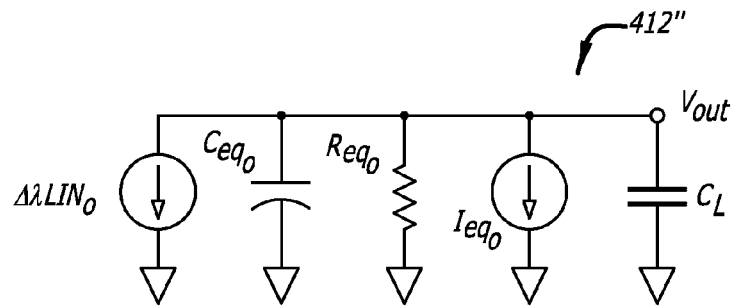
FIG. 4D illustrates a schematic diagram of a parameterized time varying Norton equivalent output model for the output of the logic gate of FIG. 4A.
Figure 4E:
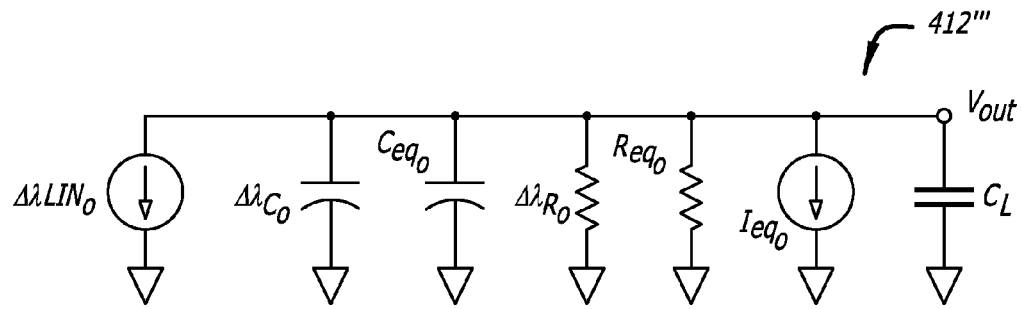
FIG. 4E illustrates a more detailed schematic diagram of a parameterized time varying Norton equivalent output model for the output of the logic gate of FIG. 4A.
Figure 4F:
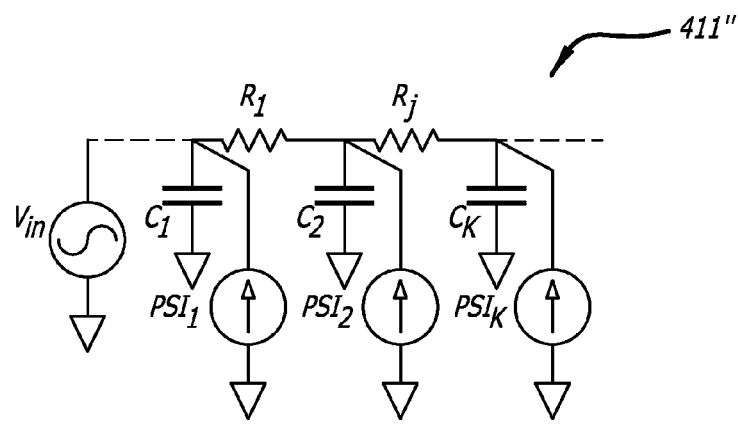
FIG. 4F illustrates a schematic diagram of a non-simplified time varying linear equivalent input model.

FIG. 4F illustrates a time varying linear equivalent model 411" for a non-linear circuit including input conductance (resistance) $R_1$ through $R_j$, input capacitance $R_1$ through $R_j$, and extra pseudo current sources $PSI_1$ through $PSI_k$.

Note that Equation (7) represented the input model of the equivalent linear network for the non-linear circuit. The terms of Equation (7) may be rewritten into the S-domain (frequency domain). Additionally, an equivalent output model for the equivalent linear network for the non-linear circuit may be obtained by rewriting Equation (7) into Equation (8A) as follows:

$$(sC+G)v=-I$$

$$Yv=-I \qquad (8A)$$

In Equations (8A), C, G, and I are respectively the capacitance matrix (C), conductance (G) matrix, and the pseudo current source vector (I) for the output node.

Equations (8A) may be further rewritten by breaking the variable v into two parts: $v=[v_1 v_2]^T$ where $v_1$ is the state-variable corresponding to the output node (or input node) of interest in the circuit, and $v_2$ is the set of all other state-variables which may be repeated for different time points. In matrix form Equation (8A) with variables $v_1$ and $v_2$ would be written as $$\begin{bmatrix} Y_{11} & Y_{12} & \cdots & Y_{1n} \\ Y_{21} & Y_{22} & \cdots & Y_{2n} \\ \vdots & \vdots & & \vdots \\ Y_{n1} & Y_{n2} & \cdots & Y_{nn} \end{bmatrix} \begin{bmatrix} v_1 \\ v_2 \\ \vdots \\ v_n \end{bmatrix} = \begin{bmatrix} I_1 \\ I_2 \\ \vdots \\ I_n \end{bmatrix} \quad (8B)$$

Extracting the first two current equations from the matrix, the state-space equation may be rewritten in terms of the state variables $v_1$ and $v_2$ as follows:

$$Y'_{11} v'_1 + Y'_{12} v'_2 = I'_1$$

$$Y'_{21} v'_1 + Y'_{22} v'_2 = I'_2 \quad (9A)$$

$$Y'_{11} = Y_{11}$$

$$I'_1 = I_1$$

$$v'_1 = v_1 \quad (9B)$$

In the pair of Equations (9A), $Y'_{11}$ is $Y_{11}$, $I'_1$ is $I_1$, and $v'_1$ is $v_1$ of the matrix equation of Equation (8B) as shown by Equations (9B). However, $Y'_{12}$ of the pair of Equations (9A) is equal to the vector $[Y_{12} \ldots Y_{1n}]$ of Equation (8B). $Y'_{21}$ of the pair of Equations (9A) is equal to the vector $[Y_{21} \ldots Y_{n1}]^T$. $Y'_{22}$ is the entire Y matrix of Equation (8B) but for the first row and first column. Also, $v'_2$ is equal to $[v_2 \ldots v_n]^T$ and $I'_2$ is equal to $[I_2 \ldots I_n]^T$.

Solving one of the pairs of Equations (9A) for the variable $v_2$ and substituting it into the other one of the pairs of Equation (9) gives us Equation (10A) as follows:

$$(Y'_{11} - Y'_{12} Y'_{22}{}^{-1} Y'_{21}) v'_1 = I'_1 - Y'_{12} Y'_{22}{}^{-1} I'_2 \quad (10A)$$

Equation (10A) can be simplified down to Equation (10B) as follows:

$$Y_{eq} v'_1 = I_{eq} \quad (10B)$$

where $Y_{eq} = (Y'_{11} - Y'_{12} Y'_{22}{}^{-1} Y'_{22})$ and $I_{eq} = I'_1 - Y'_{12} Y'_{22}{}^{-1} I'_2$.

The inverse matrix term $Y'_{22}{}^{-1}$ in the equivalent current source equation $I_{eq}$ and the equivalent conductance equation $Y_{eq}$ may be obtained by a first order Taylor series expansion around a frequency s of zero (s=0) where it is approximated by Equation (10C) as follows:

$$Y'_{22}{}^{-1} \approx (sC_{22} + G_{22})^{-1} \approx G_{22}{}^{-1} + s(-G_{22}{}^{-1} C_{22} G_{22}{}^{-1}) \quad (10C)$$

Matching $0^{th}$ and $1^{st}$ order expansion of $Y_{eq} v = I_{eq}$ of Equation 10B to $(sC_{eq} + G_{eq})v = I_{eq}$ and matching terms that have sv, v, and unity, the equivalent output conductance, capacitance and pseudo current source values may be determined from Equations (11A)-(11C) as follows:

$$C_{eq_o} = C_{11} - C_{12} G_{22}{}^{-1} G_{21} - G_{12} G_{22}{}^{-1} C_{21} + G_{12} G_{22}{}^{-1} C_{22} G_{22}{}^{-1} G_{21} \quad (11A)$$

$$G_{eq_o} = G_{11} - G_{12} G_{22}{}^{-1} G_{21} \quad (11B)$$

$$I_{eq_o} = I'_1 - G_{12} G_{22}{}^{-1} I'_2 - s(C_{12} G_{22}{}^{-1} - G_{12} G_{22}{}^{-1} C_{22} G_{22}{}^{-1}) I'_2 \quad (11C)$$

Note that equations for the equivalent input conductance, capacitance and pseudo current source values may be similarly determined from Equations (11A)-(11C) but with input perturbation values.

In Equation (11C), the equivalent current equation ($I_{eq}$) has a first order s term, $s(C_{12} G_{22}{}^{-1} - G_{12} G_{22}{}^{-1} C_{22} G_{22}{}^{-1}) I'_2$, which is the partial derivative with respect to time $$\left( \frac{\partial}{\partial t} \right).$$

This s term of the equivalent current equation ($I_{eq}$) may be computed by taking a numerical derivative of the current component $I_2$ with respect to time. Experimental results indicate that the first order s term in the equivalent current equation ($I_{eq}$) is important to achieve an accurate model.

A perturbation method may be easily employed with Equation (11B) to obtain the equivalent conductance matrix for an output node in the form $G = G_{eq} + G_\lambda \Delta \lambda$. Similarly perturbation methods may be employed to determine the parameter dependent component of current I in matrix form of $I = I_{eq} + I_\lambda \Delta \lambda$ and the parameter dependent component of capacitance C in matrix form of $C = C_{eq} + C_\lambda \Delta \lambda$. Moreover, the output model may be parameterized with respect to input slew and output capacitive loading.

Referring now to FIGS. 4A and 4D, for example, the input slew rate of an input voltage Vin coupled into the logic gate 400 may be varied. The input slew rate may be one of the circuit parameters λ that is a variable to adjust the output waveforms of the simulation. Given the input slew λ, the time varying linearized equivalent output components may be computed as a function of the input slew λ by equations (11D)-(11F) as follows:

$$C_{eq_o}(t_0, \lambda) = C_{eq_o}(t_0) + \left. \frac{\partial C_{eq_o}}{\partial \lambda} \right|_{t_0} \Delta \lambda \quad (11D)$$

$$R_{eq_o}(t_0, \lambda) = R_{eq_o}(t_0) + \left. \frac{\partial R_{eq_o}}{\partial \lambda} \right|_{t_0} \Delta \lambda \quad (11E)$$

$$I_{eq_o}(t_0, \lambda) = I_{eq_o}(t_0) + \left. \frac{\partial I_{eq_o}}{\partial \lambda} \right|_{t_0} \Delta \lambda \quad (11F)$$

For the equations for linear equivalent output capacitance (Equation 11(D)) and linear equivalent output resistance (conductance)(Equation 11(E)), the terms with the partial derivative with respect to input slew are both zero as neither of these are varied by the input slew of the input voltage. Thus, there is no change in the output model for the linear equivalent output capacitance and linear equivalent output resistance (conductance). However, there may be a change in the output current if the input slew of the input voltage varies. Thus, the second term of Equation (11F) is added to the output model.

In FIG. 4D, the linear time varying output model 412" for a non-linear circuit is illustrated. The linear time varying output model 412" is similar to the model 412' but includes the additional current source $\Delta \lambda_{LIN_o}$. The additional current source $\Delta \lambda_{LIN_o}$ is an input waveform parameterized linear current source that is responsive to variations in a parameter of the input waveform to the non-linear circuit. The model may be also parameterized with variations in the output load capacitance by adding the capacitance load $C_L$ to the model 412" as illustrated. Note also that while only one input waveform parameterized linear current source is shown, one or more input waveform parameterized linear current sources may be instantiated to model a plurality of parameter variations in the input waveform.

In FIG. 4E, a linear time varying output model 412''' for the non-linear circuit is illustrated. The linear time varying output model 412''' is similar to the model 412'' but further includes one or more parameterized time varying linear equivalent capacitors $\Delta\lambda c_o$ and one or more parameterized time varying linear equivalent resistors $\Delta\lambda_{Ro}$. The linear time varying output model 412''' may also include one or more input waveform parameterized linear current sources $\Delta\lambda_{LINo}$. Generally, the one or more parameterized time varying linear equivalent output capacitors $\Delta\lambda c_o$, the one or more parameterized time varying linear equivalent output resistors $\Delta\lambda_{Ro}$, and one or more input waveform parameterized linear output current sources $\Delta\lambda_{LINo}$ model the variance in one or more selected circuit parameters that are used to analyze the electronic circuit design.

If selected circuit parameters differ from the model circuit parameters used to characterize the non-linear gate to the time varying linear gate model, the one or more parameterized time varying linear equivalent resistors $\Delta\lambda_{Ro}$, capacitors $\Delta\lambda c_o$, and current sources $\Delta\lambda_{LINo}$ can model the variance in one or more selected circuit parameters with the time varying linear gate model. The variance in the selected circuit parameters from the model circuit parameters are parameterized to update the time varying linear gate model and the state space equations with the parameterized variance in the selected circuit parameters. The updated state-space equation for the non-linear logic gate is used to determine a vector representation of a voltage waveform at an output of the logic gate.

Generally, the selected circuit parameters that may vary from that used to characterize the model of the non-linear logic gate include process parameters (e.g., threshold voltage, oxide thickness), transistor parameters (e.g., width, length), input waveform parameters (e.g., rise-time, fall-time, input slew), output parameters (e.g., output capacitance loading), environmental parameters (e.g., temperature, power supply voltage), or a combination thereof.

Coefficients use to model the selected circuit parameters may be determined in a number of ways. In one case, the coefficients for circuit parameters of the time varying linear gate model are determined by selecting a set of coefficients from a plurality of sets of coefficients. The one selected corresponds to the best matching or nearest value of the selected circuit parameter. In another case, the coefficients for the time varying linear gate model may be determined by parameterization through computations.

In another case, a plurality of models with coefficient matrices over a range of circuit parameters are made available for selection. The closest model of the plurality of models is selected by evaluation. The coefficients for the time varying linear gate model are determined by parameterizing the variations in the circuit parameter for the time varying linear gate model. The parameterized model is selected from the plurality of parameterized models in response to a comparison of the modeled circuit parameter with the parameterized circuit parameter.

The time varying linear equivalent input model for the non-linear circuit may be computed with similar strategy to obtain one or more parameterized time varying linear equivalent input capacitors $\Delta\lambda c_i$, one or more parameterized time varying linear equivalent input resistors $\Delta\lambda_{Ri}$, and one or more input waveform parameterized linear input current sources $\Delta\lambda_{LINi}$. Usually, the input equivalent model for a non-linear digital gate has only a capacitive term as input leakage currents of metal oxide field effect transistors (MOS-FET) used in digital logic circuits is usually minimal. In the embodiments of the invention, the method of construction of approximate linear network input model for the non-linear circuit accounts for the current source, the conductance term and the capacitance term, as well as pseudo current sources for the generated model that may be used to balance the state space charge-current equation.

Reduced Order Model of Interconnect

As previously mentioned herein, the interconnects between logic gates were modeled in block 206 of FIG. 2. The state vector equations representing the interconnects between logic gates are reduced in order to obtain a linear reduced order model. Schur-transform based model order reduction technique may be used to accelerate the computations for the parasitic components in the compressed representation.

Figure 5A:
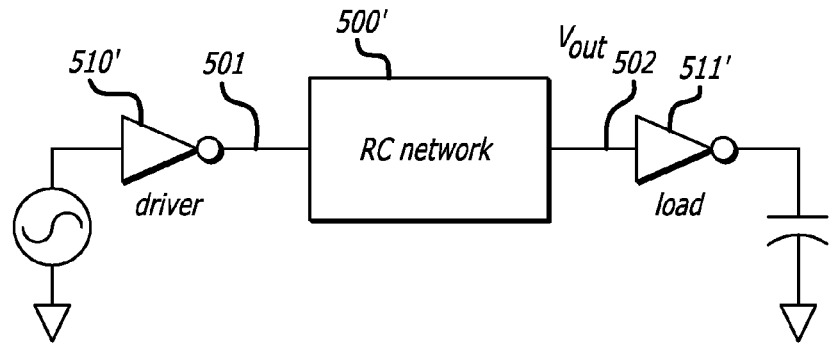
FIG. 5A illustrates a schematic block diagram of an interconnect network coupled between a driver and a fan-out load of a receiver.
Figure 5B:
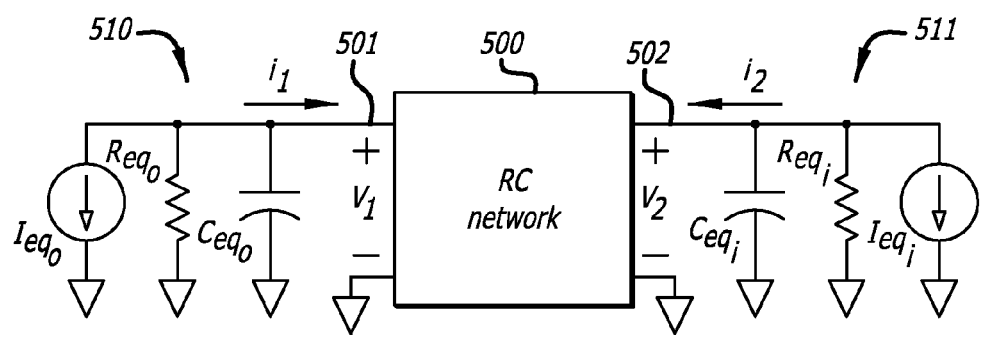
FIG. 5B illustrates a combined model of the block diagram of FIG. 5A including a linear interconnect network coupled between time varying equivalent input and output models for a nonlinear circuit.
Figure 5C:
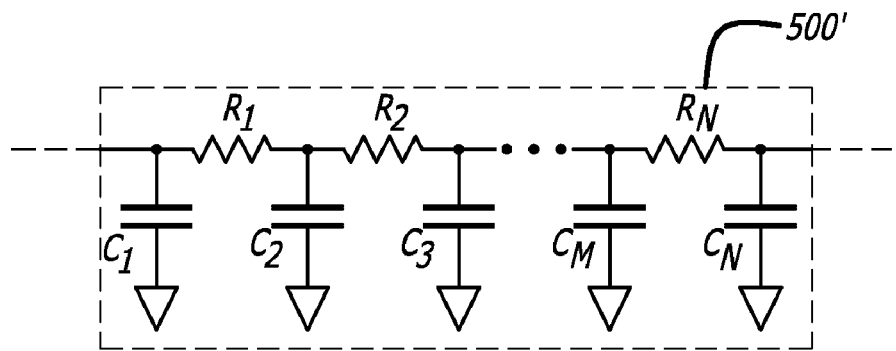
FIG. 5C illustrates a schematic diagram of a non-compressed non-simplified interconnect network.

Referring now to FIG. 5C, parasitic extraction of interconnections between pins of logic gates/transistors can provide a large number of linear passive components, such as the linear interconnect network 500' including the plurality of RC connections of $R_1$-$R_N$ and $C_1$-$C_N$ as shown. It is expensive to directly solve the resulting system of equations for each and every linear passive component of the interconnect in an integrated circuit.

Figure 5D:
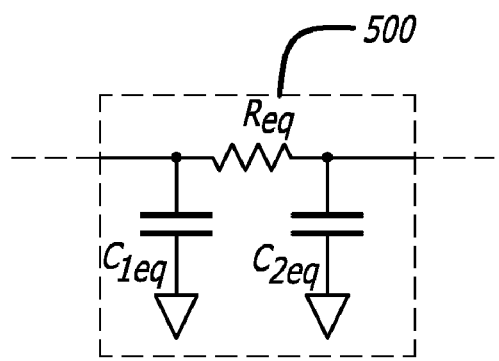
FIG. 5D illustrates a schematic diagram of a compressed simplified interconnect network.

Referring now to FIG. 5D, to reduce the cost of simulating the integrated circuit, a reduction in the number of linear passive components is desirable. Any suitable model order reduction (MOR) techniques, such as Kyrlov subspaces and a passive reduced order interconnect macromodeling algorithm (described in "PRIMA: passive reduced order interconnect macromodeling algorithm" by A. Odabasiouglu et al. TCAD, Vol. 17, No. 8, pages 645-654, 1998, which is incorporated herein by reference), may be used to compress the large number of equations representing the linear components in the interconnect 500' down to a reduced order model of interconnect, such as the equivalent interconnect network 500 including the equivalent resistor Req and the pair of equivalent capacitors $C_{eq1}$ and $C_{eq2}$ as shown.

For the interconnect, the state-space equations of order N with the state vector x of length N may be written into Equations (12A)-(12B) as follows:

$$C\dot{x}+Gx=Bu \quad (12A)$$

$$y=Lx \quad (12B)$$

In Equation (12A), C is the capacitance matrix, G is the conductance (resistance) matrix, and B is the control matrix. As mentioned previously, x is the state vector while u is a vector representing inputs to the circuit. In Equation (12B), y is the output vector and L is the output matrix, and x is the state vector.

A reduction matrix V of size N×q may be formed through Krylov methods to reduce the matrices where x≅Vz and Equations (12A)-(12B) can be rewritten using the variable z into Equations (13A)-(13B) as follows:

$$\tilde{C}\dot{z}+\tilde{G}z=\tilde{B}u \quad (13A)$$

$$y=\tilde{L}z \quad (13B)$$

where $\tilde{C}=V^TCV$, $\tilde{G}=V^TGV$, $\tilde{B}=V^TB$, and $\tilde{L}=LV$ with $V^T$ representing a transposed reduction matrix.

Equations (13A)-(13B), representing the reduced order model for the interconnect, are relatively easy to solve because the order of the resulting system of equations is q where q<<N.

Combining Logic Gate/Transistor Model with Interconnect Model

As described previously with reference to block 208 of FIG. 2, a new set of matrix equations are formed to combine the linear reduced order model of interconnect with the equivalent time varying gate input and output models. The combined matrix equations may then be directly solved using well known linear algebra solution techniques to provide a representation of a full waveform. Alternatively, the combined matrix equations may be solved using a Galerkin approximated method and a Schur transformation, both of which are well known, to provide a highly compressed representation of a full waveform. Either of these full waveform representations can readily be passed through an entire integrated circuit to provide a complete circuit analysis. However, in a preferred embodiment of the invention, the highly compressed representation of the full waveform is the more efficient form to pass through an entire integrated circuit design to generate circuit analysis results. (The Galerkin approximated method and the Schur transformation are described further below under the heading WAVEFORM COMPRESSION FOR MORE EFFICIENT SIMULATION.)

The combined set of state-space equations are generated by combing the equivalent time varying model for the logic gates and the reduced order models for linear interconnect network.

Referring for a moment to FIG. 5A, a schematic diagram illustrates a circuit that is desirable to model in order to efficiently simulate its timing. The circuit includes a linear RC interconnect network block 500' coupled at its input 501 and its output 510 between a non-linear driver circuit element 510' and a non-linear receiver circuit element 511', respectively. The non-linear driver circuit element 510' may be modeled by a linear time varying equivalent output model. The non-linear receiver circuit element 511' may be modeled by a linear time varying equivalent input model. The linear RC interconnect network block 500' may be the linear RC interconnect network 500' illustrated in FIG. 5C for example. The linear RC interconnect network block 500' may be modeled by a linear reduced order model of interconnect network, such as the linear equivalent interconnect network 500 illustrated in FIG. 5D.

Referring now to FIG. 5B, a schematic diagram illustrates a reduced order interconnect block 500 having an input 501 coupled to a first non-linear circuit element 510 and an output 502 coupled to a second non-linear circuit element 511. The reduced order interconnect block 500 is a linear interconnect network representing a large number of R, L and C elements. The first non-linear circuit element 510 is an equivalent time varying Norton output model (output current $Ieq_o$, output resistance $Req_o$, output capacitance $Ceq_o$) of the output of a logic gate, such as a buffer, inverter, or other type of output driver. The second non-linear circuit element 511 is an equivalent time varying Norton input model (input current $Ieq_i$, input resistance $Req_i$, input capacitance $Ceq_i$) of one or more inputs of logic gates representing the fan-out load applied to the output of the linear interconnect network 500. The equivalent time varying Norton input model and the equivalent time varying Norton output model are discussed herein.

In order to solve for the combined models (the linear network model of interconnect and the time varying equivalent models for input and output) of the circuit of FIG. 5, the currents ($i_i$ and $i_2$) and voltages ($v_i$ and $v_2$) at nodes 501 and 502 of the interfaces between the models are respectively analyzed. The state-space equations for the combined circuit of FIG. 5 may be written as Equations (14A)-(14E) as follows:

$$I_{tho} + \frac{v_1}{R_{tho}} + C_{tho}\dot{v}_1 + i_1 = 0 \tag{14A}$$

$$I_{thi} + \frac{v_2}{R_{thi}} + C_{thi}\dot{v}_2 + i_2 = 0 \tag{14B}$$

$$v_1 = \begin{bmatrix} 1 & 0 & 0 & \ldots & 0 \end{bmatrix} v = b_1^T v = \tilde{b}_1^T z \tag{14C}$$

$$v_2 = \begin{bmatrix} 0 & 1 & 0 & \ldots & 0 \end{bmatrix} v = b_2^T v = \tilde{b}_2^T z \tag{14C}$$

$$\tilde{C}\dot{z} + \tilde{G}z + \tilde{b}_1 i_1 + \tilde{b}_2 i_2 = 0 \tag{14E}$$

where z is the state; v is the matrix of voltages $v_1$ and $v_2$, $\dot{v}_1$ and $\dot{v}_2$ are the partial derivatives (having a dot above the respective letter) of the voltages with respect to the state z; $\tilde{C}$ and $\tilde{G}$ are the equivalent capacitance and conductance matrices; $\tilde{b}_1$ and $\tilde{b}_2$ are the matrices connecting the input and output of the RC network to the input and output non linear gate models; $\tilde{b}_1^T$ and $\tilde{b}_2^T$ represent reduced versions of these matrices; and $I_{tho}$, $R_{tho}$, $C_{tho}$ and $I_{thi}$, $R_{thi}$, $C_{thi}$ represent the initial Norton-equivalent output current, resistance, and capacitance driving input node 501 and the initial Norton-equivalent input current, resistance, and capacitance loading output node 502, respectively.

A new set of matrix equations may be generated for Equations (14A)-(14E) from the reduced order state-space equation for interconnect network by adding four new variables viz $v_1$, $v_2$, $i_1$ and $i_2$ and their corresponding four new equations. The resulting sets of equations may then be solved directly. Alternatively, the resulting sets of equations may be more simply solved by using a Galerkin method and a Shur Transformation.

Waveform Compression for More Efficient Simulation

As described previously with reference to block 208, the combined matrix equations for the linear interconnect network and the linear input and output models of the logic gates may be solved using a Galerkin approximated method and a Schur transformation to provide a highly compressed representation of a full waveform. The Galerkin method is generally described in "Finite Element Methods and Their Applications" by Z. Chen, published by Springer, 2005. The Schur transformation is generally described in "Introduction to Linear Algebra" by L. W. Johnson et al., Addison Wesley, 2001.

The Galerkin method defines a set of equations that can be solved for obtaining the coefficients that describe the waveforms (note that these equations can also integrated with the perturbation analysis) in the integrated circuit at each node. To provide computational efficiency, a small set of basis vectors may be determined that are well-matched to the representing output waveforms of non-linear circuits. Another type of pre-characterization of the gates of the circuit, empirical unsupervised learning, may be used to obtain a small set of basis vectors that may be used to represent the output waveforms. As described further herein, to determine the basis vectors for use in Galerkin method, a set of possible output waveforms for each non-linear circuit or logic gate is determined for variations in one or more circuit parameters.

The Galerkin method is a standard spectral technique to solve a system of equations of the form $$L(y(x))+f(x)=0 \tag{15}$$

where L is any linear differential operator. In the Galerkin method it is assumed that the solution to Equation (15) is in the form $$y(x) \approx u(x) = \sum_{j=1}^{N} c_j \phi_j(x) \quad (16)$$

where $c_j$ is a set of coefficients and $\phi_j(x)$ is a set of basis vectors for j=1, 2, ..., N.

The residue of Equation (15) may be determined by Equation (17) as follows:

$$r(x) = L(u(x)) + f(x) \quad (17)$$

The constant coefficients $c_j$ in Equation (16) are obtained by making the residue orthogonal to the set of basis vectors. This results in a set of N equations that when solved provides the N $c_j$ coefficients corresponding to the N variables in the circuit's state space equation.

$$\int_a^b \phi_i(x)[L(u(x)) + f(x)]dx = 0 \text{ for } i = 1, \ldots, N \quad (18)$$

Equation (18) is used to find the values for the N $c_j$ coefficients.

Equations (14A), (14B), and (14E) are of the form of Equation (15) that may be solved by the Galerkin method. Thus, the set of Equations (14A), (14B), and (14E) representing the combined modeled circuits of FIGS. 5A-5B, are solved using the Galerkin method.

The computation of the solution to the set of Equations (14A), (14B), and (14E) may be further simplified by applying a Schur transform.

To use a Schur transform and simplify the computations for the solutions to the equations of combined models, an assumption is made regarding the solution to the state space equation, Equation (14E). The assumption that is made is that, for all of the state-vectors z, the solution of the state space equation, Equation (14E), is a linear combination of a suitably chosen set of basis vectors. For example, the voltage $v_i$ may be represented by a linear combination of basis vectors $[\phi_1 \ldots \phi_q]$ of a basis function $\phi_k$ written in equation form as follows in Equation (19A):

$$v_i \cong \sum_{k=1}^{q} c_k^i \phi_k(x) \quad (19A)$$

Equation (19A) may be simplified into a matrix form equation as follows in Equation (19B):

$$v_i = \Phi C^i \quad (19B)$$

where the matrix of basis vectors $\Phi = [\phi_1 \ldots \phi_q]$ and the matrix of coefficients $$C^i = [c_1^i \ldots c_q^i]^T \text{ for the } i^{th} \text{ node.}$$

If the basis function $\phi_k$ is a vector consisting of voltage values at different time points, instead of performing the analytic integration specified in Equation (18) with respect to the basis function $\phi_k$, a dot product may be used instead to simplify computations.

Rewriting initial differential equation (Equation 14) in the form of Equation 18 by integrating with respect to all the basis vectors and then rearranging the terms, the following set of equations are obtained:

$$(C \otimes \Delta + G \otimes I_q)(I_N \otimes S^{-1}) \begin{bmatrix} c_1^1 \\ c_1^q \\ \vdots \\ c_N^1 \\ c_N^q \end{bmatrix} + (I_N \otimes S^{-1}) \begin{bmatrix} \phi_1^T I_1 \\ \phi_1^T I_N \\ \vdots \\ \phi_q^T I_1 \\ \phi_q^T I_N \end{bmatrix} = 0 \quad (20)$$

where S and $\Delta$ are obtained by the eigenvalue decomposition of $[\Phi^T \dot{\Phi}]$ as follows.

$$[\Phi^T \dot{\Phi}]S = S\Delta \quad (21)$$

In Equations (20) and (21), $\dot{\Phi}$ is the time derivative of $\Phi$ and $I_N$ is an identity matrix of size N.

Reordering the equations generates a huge linear matrix equation of the form of Equation (22) as follows:

$$[A][C] = [b] \quad (22)$$

or AC=b, where A is an Nq by Nq square matrix, C is an Nq by 1 matrix (shown in Equation 20), and b is an Nq by 1 matrix. However, only the block diagonal elements of the matrices have non-zero elements. Thus, the matrices are very easy to evaluate. In Equation (22), C is a column vector consisting of all the $c_j$ coefficient values of waveform representation for all the nodes in the circuit of FIG. 5B, N is the number of variables in Equation (14), and q is the number of basis vectors.

For perturbation models, the same set of equations (20)-(22) may be used with one or more added input terms for each circuit parameter $\lambda$. The perturbation model appears in the form of Equation (23) as follows.

$$[A][C] = [b] + \Delta \lambda [b'] \quad (23)$$

or AC=b+$\Delta \lambda$b', where A is an Nq by Nq square matrix, C is an Nq by 1 matrix (shown in Equation 20), and b and b' are Nq by 1 matrices. If additional circuit parameters $\lambda$ are to be considered, additional terms can be added into Equation (23), such as in AC=b+$\Delta \lambda_1 b_1$'+$\Delta \lambda_2 b_2$' for two parameters (e.g., input slew and output capacitance). This enables the model to be used for variation aware static timing analysis as well as statistical static timing analysis.

The sets of equations of Equations (22)-(23) may be solved very efficiently to extract coefficients of the basis vectors that satisfy the differential equation of Equation (14).

The voltage waveforms at all the nodes in the circuit are obtained by using Equation (19). The same methodology is repeated for different driver-interconnect-load blocks for each node so that a static timing analysis can be performed on any given circuit stage within the integrated circuit.

Basis Vectors for Compressed Output Waveforms

To provide computational efficiency with the Galerkin method, a small set of basis vectors are determined to compress the number of output waveforms that are represented by coefficients. The coefficients may be saved in matrices and multiplied by the basis vector when needed. The set of basis vectors are chosen so that when multiplied by coefficients they substantially represent an output waveform of a non-linear circuit. Different sets of basis vectors may be stored in advance in a logic cell library depending on what type of non-ideal behaviors are expected from the circuit, for example, spike, overshoot, ringing, etc. The basis vectors may be orthogonal basis vectors or non-orthogonal basis vectors. For N orthogonal basis vectors, N orthogonal polynomials may be selected for the compressed output waveforms, where the value of N determines a tradeoff between accuracy and efficiency of computations. Generally, two polynomials are orthogonal to each other if their inner product is zero.

In one embodiment of the invention, the orthogonal polynomials are Legendre polynomials. Each Legendre polynomial is an nth-degree polynomial that may be expressed as:

$$P_n(x) = \frac{1}{2^n n!} \frac{d^n}{dx^n}[(x^2-1)^n].$$

In another embodiment of the invention, the orthogonal polynomials are Chebychev polynomials of a first or second kind.

The Chebyshev polynomials of the first kind are defined by recurrence relation equations as follows:

$$T_0(x)=1$$

$$T_1(x)=x$$

$$T_{n+1}(x)=2xT_n(x)-T_{n-1}(x)$$

One example of a generating function for $T_n$ is $$\sum_{n=0}^{\infty} T_n(x)t^n = \frac{1-tx}{1-2tx+t^2}.$$

The Chebyshev polynomials of the second kind are defined by recurrence relation equations as follows:

$$U_0(x)=1$$

$$U_1(x)=2x$$

$$U_{n+1}(x)=2xU_n(x)-U_{n-1}(x)$$

One example of a generating function for $U_n$ is $$\sum_{n=0}^{\infty} U_n(x)t^n = \frac{1}{1-2tx+t^2}.$$

Figure 3:
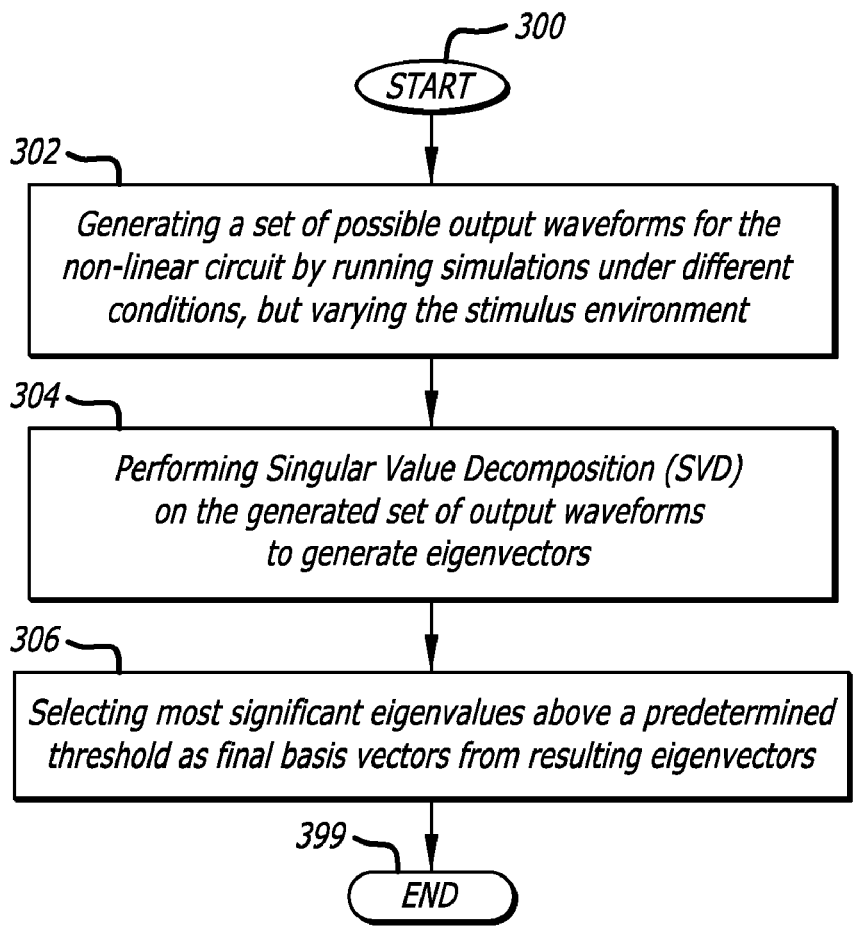
FIG. 3 is a flow chart of a method for obtaining basis vectors for compression of waveforms.
Figure 6A:
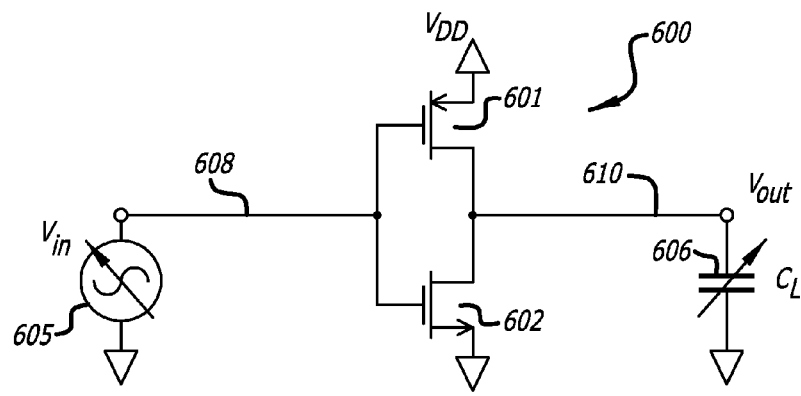
FIG. 6A illustrates a schematic diagram of an inverter to characterize with a variable capacitance load to obtain a set of output waveforms.
Figure 6B:
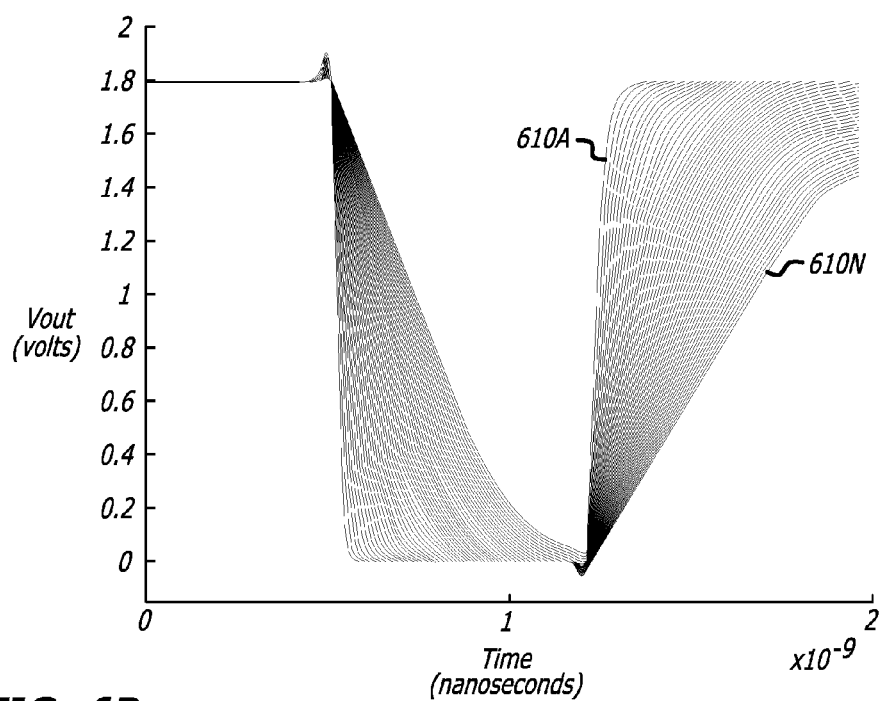
FIG. 6B illustrates a waveform diagram of an exemplary set of output waveforms in response to variance of a circuit parameter.

Reference is now made to FIG. 3 and FIGS. 6A-6B. FIG. 3 shows a flow chart illustrating a method of basis vector selection for compressing a representation of output waveforms. The method starts at block 300 and then goes to block 302.

At block 302, a set of possible output waveforms for each non-linear circuit or logic gate, such as waveforms 610A-610N shown in FIG. 6B, are generated during characterization of each logic gate of a cell library. The basis vectors used in the Galerkin method for each circuit are computed from the sets of possible output waveforms of the circuit.

FIG. 6A illustrates an exemplary logic gate 600, an inverter, including a p-channel field effect transistor (PFET) 601 and an n-channel field effect transistor (NFET) 602 coupled together and to the power supply (VDD, ground) as shown. The output waveforms, such as output waveforms 610A-610N shown in FIG. 6B, are generated by running SPICE transistor level circuit simulations under different conditions while varying the stimulus environment for each type of non-linear circuit or logic gate that may be instantiated in the integrated circuit.

For example, a plurality of SPICE simulations may be run on the inverter 600 with adjustments in the load capacitor $C_L$ 606 on the output node 610 with a constant input signal waveform $V_{in}$ 605 applied to the input node 608 in one set of simulations. The plurality of SPICE simulations are run varying the capacitance of the load capacitor $C_L$ 606 from simulation to simulation over a range of load capacitance values to determine the vector/matrix for each output waveform 610A-610N. As another example, a plurality of SPICE simulations may be run on the inverter 600 with adjustments in the input slew rate of the input signal waveform $V_{in}$ 605 with a constant load capacitor $C_L$ 606 for another set of simulations. The plurality of SPICE simulations are run varying the input slew rate of the input signal waveform to each gate from simulation to simulation over a range of input slew rate values to determine the vector/matrix for each output waveform. The underlying idea is that for a particular circuit instance, the waveforms generated at its output can differ due to the shape (e.g., input slew) of an input signal waveform and/or due to the capacitance load $C_L$ at the output of the circuit.

The output waveforms are vectors that can be represented by matrix M. Not all of the output waveforms are needed to generate a relatively accurate representation of the output waveforms so that the representation may be compressed.

At block 304, a singular value decomposition (SVD) may be performed on the matrix M representative of the generated set of output waveforms in order to generate eigenvectors. A singular value decomposition (SVD) is an important factorization of a rectangular real or complex matrix. Each of the matrices representing the output waveforms may be factorized into the form of Equation (24) to provide a singular-value decomposition of the matrix M as follows:

$$M=U\Sigma V^* \qquad (24)$$

where U is an m-by-m unitary matrix, the matrix Σ is m-by-n with nonnegative numbers on the diagonal (as defined for a rectangular matrix) and zeros off the diagonal, and V* denotes the conjugate transpose of V, an n-by-n unitary matrix. The matrix V thus contains a set of orthonormal basis vector directions for M. The matrix U contains a set of orthonormal basis vector directions for M. The matrix Σ contains the singular values. The SVD of the matrix M may be used to determine the eigenvalues and hence, a set of most significant eigenvectors that could be used as an orthonormal basis to represent the vectors formed by columns of matrix M.

At block 306, the most significant eigenvalues above a fixed predetermined threshold may be used to choose the final basis vectors from the resulting eigenvectors. These selected eigenvectors form the basis vectors for use in Galerkin method to provide compressed output waveform representation for computing efficiency during simulation. The predetermined threshold provides a mechanism to trade-off between accuracy and simulation time. If more efficiency is desired to reduce simulation time in trade for reduced accuracy, the predetermined threshold may be increased so that fewer basis vectors are used to represent waveforms. If greater accuracy is desired to achieve better simulation results in trade for greater simulation time, the predetermined threshold may be reduced so that more basis vectors are used to represent waveforms. After the eigenvectors with the more significant eigenvalues have been selected as the basis vectors to represent the output waveforms in a compressed format, the process may end at block 399.

Electronic Design Automation System

Figure 8A:
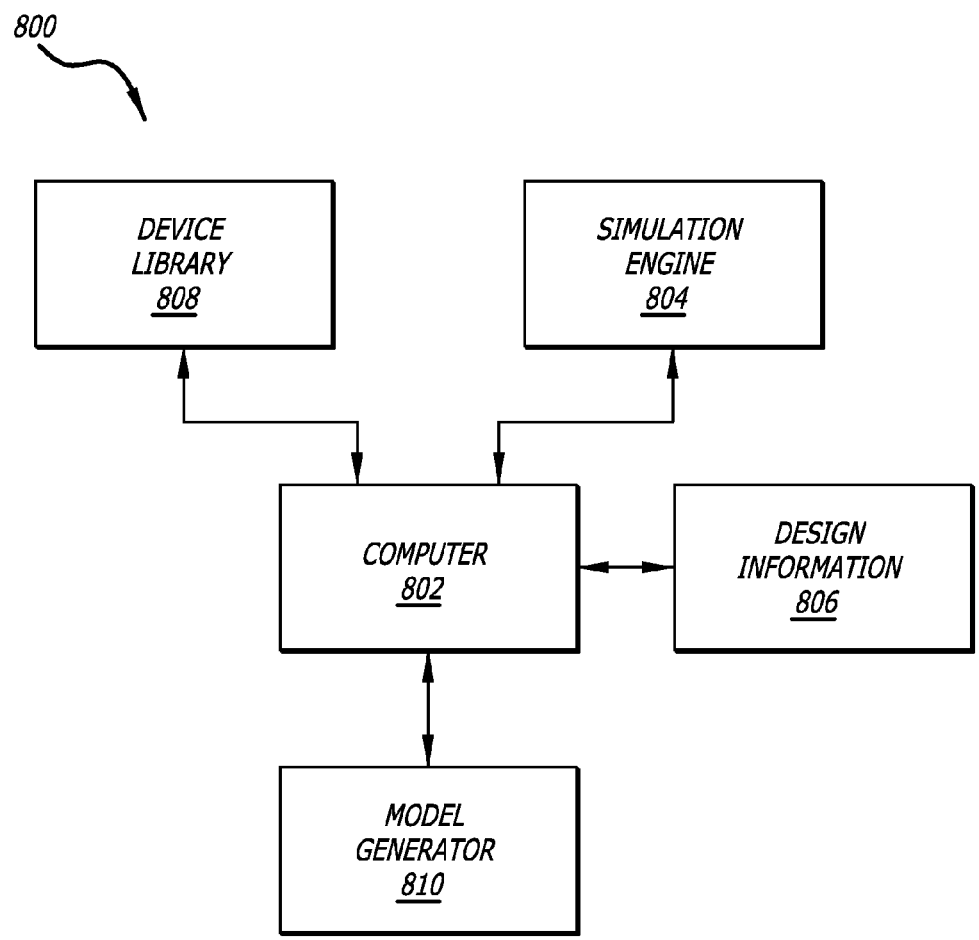
FIG. 8A illustrates a block diagram of an electronic computer aided design (ECAD) automation system.

Referring now to FIG. 8A, a block diagram of an electronic design automation system 800 for performing the WAVSTAN algorithmic methods is illustrated. The electronic design automation system 800 includes a computing system or computer 802, a simulation engine 804, a design information database 806 stored in a storage device, a device library stored in a storage device, and a model generator 810.

The computer 802 executes the simulation engine 804 for simulating the operation and performance of an electrical circuit under design. The simulation engine 804 may be a static timing analyzer or a statistic static timing analyzer. The computer 802 receives design information 806, such as a net list of a circuit design, corresponding to the electrical circuit under design. The computer 802 retrieves corresponding models from a device library 808, and executes a design simulation (e.g., a static timing analysis or a statistical static timing analysis) using the simulation engine 804. The simulation engine 804 executed by the computer 802 solves vector equations and performs matrix operations to represent the output waveforms and push waveforms through the circuit design in order to perform the WAVSTAN algorithmic method described herein.

The electronic design automation system 800 may further comprise a model generator 810 for generating device models for standard cell circuits (logic cells) that are stored in the device library 808. The model generator 810 may be used to characterize or pre-characterize each logic cell or standard cell circuit for output waveforms, parameter variations, and basis vectors which may be stored with the device library to perform the WAVSTAN algorithmic method described herein.

For simulation, the model generator 810 may be used to generate the linear time varying input and output equivalent models for each non-linear standard circuit cell or logic cell instantiated in the netlist. The model generator 810 may be used to generate the linear reduced order model of the RC interconnect between each instantiation of a standard circuit cell or logic cell. The model generator 810 may be used to combine the models together and form vector equation solutions to form output waveforms of a circuit stage in response to different circuit parameters.

While the models that are generated may be linear for ease of computations, the output waveforms are not limited to linear waveform expressions. The resulting output waveform expressions may include non-linear waveform expressed portions, such as an exponential waveform expressed portion.

The simulation engine 804, the design information 806, the device library 808, and the model generator 810 may reside in an internal storage device (e.g., memory or hard drive) or external storage device (e.g., hard drive, storage media) that may be respectively internal or external to the computer 802.

Figure 8B:
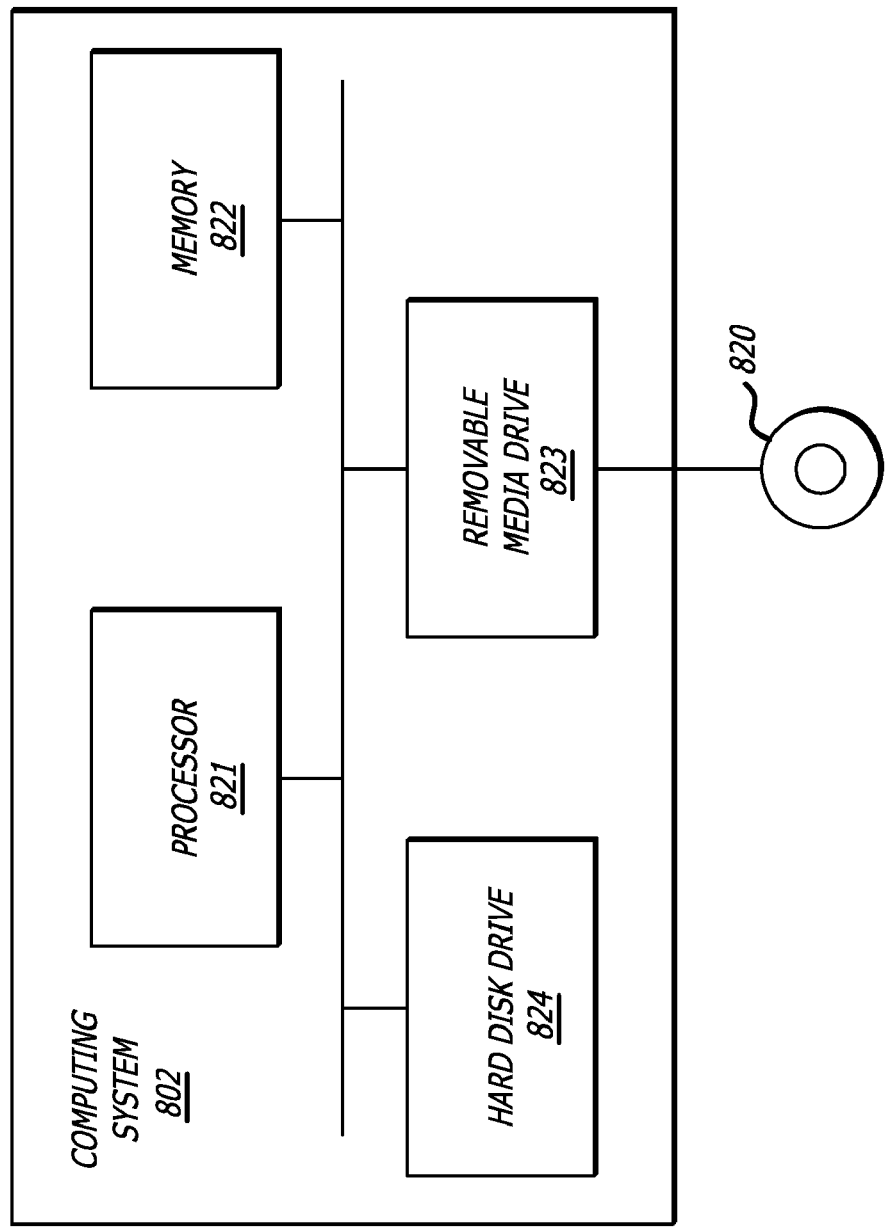
FIG. 8B illustrates an exemplary embodiment of a computing system for use in the ECAD automation system.

Referring now to FIG. 8B, a computing system 802 is illustrated that may be used to perform some or all of the processes in accordance with a number of embodiments of the invention. The computing system 802 may include a processor 821, a memory 822, a removable media drive 823, and a hard disk drive 824. In one embodiment, the processor 821 executes instructions residing on a machine-readable medium, such as the hard disk drive 824, a removable medium 820 (e.g., an optical medium (compact disk (CD), digital video disk (DVD), etc.), a magnetic medium (magnetic disk, a magnetic tape, etc.), or a combination of both.

The instructions may be loaded from the machine-readable medium into the memory 822, which may include Random Access Memory (RAM), dynamic RAM (DRAM), etc. The processor 821 may retrieve the instructions from the memory 822 and execute the instructions to perform the operations described above.

Note that any or all of the components and the associated hardware illustrated in FIG. 8B may be used in various embodiments of the system 800. However, it should be appreciated that other configurations of the system 800 may include more or less devices than those shown in FIG. 8B.

Some portions of the preceding detailed description have been presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the non-manual, automatic, or automated action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The embodiments of the invention also relate to an apparatus or system for performing the operations described herein. This apparatus may be specially constructed for the required purposes, or it may comprise a general-purpose computer selectively activated or reconfigured by a computer program stored in the computer.

When implemented in a computer program or software, the elements of the embodiments of the invention are essentially the code segments to perform the necessary tasks. The program or code segments can be stored in a computer or processor readable storage medium or transmitted by a computer data signal embodied in a carrier wave over a transmission medium or communication link. The "processor readable storage medium" may include any medium that can store or transfer information. Examples of the processor readable medium include an electronic circuit, a semiconductor memory device, a read only memory (ROM), a flash memory, an erasable programmable read only memory (EPROM), a floppy diskette, a CD-ROM, an optical disk, a hard disk, a fiber optic medium, a radio frequency (RF) link, etc. The code segments may be downloaded via computer networks such as the Internet, Intranet, etc over various transmission medium and then stored in a processor readable medium.

Note that the processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will appear from the description below. In addition, the embodiments of the invention are not described with reference to any particular programming language. It will be appreciated that a variety of programming languages may be used to implement the teachings of the invention as described herein.

CONCLUSION

The modeling scheme used for the WAVSTAN algorithmic method generates equivalent models of logic gates with low complexity to ease computations by a computer. During circuit simulation, the WAVSTAN algorithmic method avoids full time step integration by computing coefficients for basis vectors that may be stored in matrices. Some matrix equations, well suited to computer computations, are solved to simulate a circuit. During characterization of logic gates, a small additional model generation effort for computing basis vectors is required for the WAVSTAN algorithmic method to represent output waveforms in a compressed form, such as a singular value decomposition (SVD) or other compression algorithm.

A combination of time-varying modeling and Schur-complement manipulations can provide accurate rigorous models for gate level circuits incorporating input/output loading effects. A perturbation analysis allows pre-characterization of the logic gates for not only their performance of a single, fixed gate instance, but the entire range of behavior of a gate topology with respect to variable circuit parameters. A combination of waveform compression and spectral (Galerkin) approximation allows a highly compressed representation of the full waveform to be passed through a complete circuit to perform a static timing analysis without large computational complexity. A Schur-transform-based model order reduction technique accelerates treatment of parasitic components in the compressed representation of the waveforms.

The model extraction process for both the gates and interconnects is based on a solid mathematical foundation with no heuristics involved. The dependence of the gate-interconnect co-simulation (Galerkin method) on basis-waveforms provides an efficient trade-off between simulation speed and modeling accuracy to the user. The method also provides for efficient encapsulation of process variation information about the circuit and their effects on the waveforms they process. Since the methodology is regression based, the models have a tuning capability. The better the model training, the better the results of the simulation. If a user desires simulation results for large variations in a circuit parameter exceeding the training conditions, the model degrades slowly and nicely with the larger variations in test conditions. That is, the models are accurate for the trained parameter values, but also degrade systematically over large variations in the parameters from those where the models were extracted. The embodiments of the invention can achieve accurate timing results while reducing the computational time and the energy expended towards generating those results.

Another type of gate model is a multi-channel connected components (multi-CCC) current source model that is shown and described in U.S. patent application Ser. No. 11/849,254 filed on Aug. 31, 2007 by inventors Vinod Kariat et al., entitled SENSITIVITY AND STATIC TIMING ANALYSIS FOR INTEGRATED CIRCUIT DESIGNS USING A MULTI-CCC CURRENT SOURCE MODEL, which is incorporated herein by reference.

The embodiments of the invention are thus described. While certain exemplary embodiments have been described and shown in the accompanying drawings, it is to be understood that such embodiments are merely illustrative of and not restrictive on the broad invention, and that the embodiments of the invention not be limited to the specific constructions and arrangements shown and described, since various other modifications may occur to those ordinarily skilled in the art. Instead, the embodiments of the invention should be construed according to the claims that follow below.

What is claimed is:

1. A method for modeling non-linear logic gates in an electronic circuit design for improved accuracy and efficient computations during static timing analysis, the method comprising:

executing, with at least one processor, one or more spice transistor level circuit simulations of a circuit of a non linear logic gate using a state-space equation for a plurality of simulated time points;

for each of the simulated time points,
taking Jacobians of charge and current of the state-space equation of the non-linear logic gate to provide a capacitance matrix of a plurality of capacitors and a conductance matrix of a plurality of resistors;

forming a small-signal state-space equation for the plurality of capacitors and the plurality of resistors for a small-signal circuit equivalent of the non-linear logic gate; and manipulating the small-signal state space equation for each of the simulated time points to compute one or more time varying linear equivalent capacitors, one or more time varying linear equivalent resistors, and one or more time varying linear equivalent current sources coupled in parallel together for a time varying linear gate model at an input or output node of interest of the circuit to capture the impact of the plurality of capacitors and the plurality of resistors representing the non-linear logic gate.

2. The method of claim 1, wherein
adding one or more pseudo current sources to balance the small-signal state-space equation such that a linearized approximation of the non-linear logic gate is provided at each of the simulated time points.

3. The method of claim 1, wherein
taking a Schur complement to manipulate the small-signal state space equation for each of the simulated time points to compute the one or more time varying linear equivalent capacitors, resistors, and current sources.

4. A method for modeling non-linear logic gates in an electronic circuit design for improved accuracy and efficient computations during static timing analysis, the method comprising:

executing, with at least one processor, one or more spice transistor level circuit simulations of a circuit of a non linear logic gate using a state-space equation for a plurality of simulated time points;

for each of the simulated time points,
taking Jacobians of charge and current of the state-space equation of the non-linear logic gate to provide a capacitance matrix of a plurality of capacitors and a conductance matrix of a plurality of resistors;

forming a small-signal state-space equation for the plurality of capacitors and the plurality of resistors for a small-signal circuit equivalent of the non-linear logic gate; and taking a Schur complement to manipulate the small-signal state space equation for each of the simulated time points to compute one or more time varying linear equivalent capacitors, one or more time varying linear equivalent resistors, and one or more time varying linear equivalent current sources coupled in parallel together for a time varying linear gate model at an input node or an output node of interest of the circuit to capture the impact of the plurality of capacitors and the plurality of resistors representing the non-linear logic gate, wherein each equivalent current source equation representing each equivalent current source has an inverse matrix term including frequency as a variable, and the inverse matrix term is expressed as an Nth-order Taylor series expansion with respect to frequency.

5. The method of claim 4, wherein
the inverse matrix term is expressed as at least a first-order Taylor series expansion with respect to frequency, and
the first order term of the Taylor series is numerically differentiated with respect to time to compute its value.

6. The method of claim 1, wherein
the time varying linear gate model includes a time varying linear output model representing the output of the non-linear logic gate, the time varying linear output model has linear circuit elements coupled together in parallel between ground and the output, including
 one or more time varying linear equivalent output capacitors,
 one or more time varying linear equivalent output resistors, and
 one or more time varying linear equivalent output current sources.

7. The method of claim 6, wherein
the time varying linear output model further includes
 one or more input waveform parameterized linear current sources coupled in parallel to the one or more time varying linear equivalent output capacitors, resistors, and current sources, the one or more input waveform parameterized linear current sources responsive to the input waveform applied to the input of the non-linear logic gate.

8. The method of claim 7, wherein
the time varying linear output model further includes
 one or more parameterized time varying linear equivalent output capacitors coupled in parallel to the one or more time varying linear equivalent output capacitors, resistors, and current sources;
 one or more parameterized time varying linear equivalent output resistors coupled in parallel to the one or more time varying linear equivalent output capacitors, resistors, and current sources; and
 one or more parameterized time varying linear equivalent output current sources coupled in parallel to the one or more time varying linear equivalent output capacitors, resistors, and current sources.

9. The method of claim 6, wherein
the time varying linear gate model further includes a time varying linear input model representing the input of the non-linear logic gate, the time varying linear input model has linear circuit elements coupled together in parallel between ground and the input, including
 one or more time varying linear equivalent input capacitors,
 one or more time varying linear equivalent input resistors, and
 one or more time varying linear equivalent input current sources.

10. The method of claim 9, wherein
the time varying linear input model further includes
 one or more input waveform parameterized linear current sources coupled in parallel to the one or more time varying linear equivalent input capacitors, resistors, and current sources.

11. The method of claim 9, wherein
the time varying linear input model further includes
 one or more parameterized time varying linear equivalent input capacitors coupled in parallel to the one or more time varying linear equivalent input capacitors, resistors, and current sources;
 one or more parameterized time varying linear equivalent input resistors coupled in parallel to the one or more time varying linear equivalent input capacitors, resistors, and current sources; and
 one or more parameterized time varying linear equivalent input current sources coupled in parallel to the one or more time varying linear equivalent input capacitors, resistors, and current sources.

12. The method of claim 4, wherein
the time varying linear gate model includes a time varying linear output model representing the output of the non-linear logic gate, the time varying linear output model has linear circuit elements coupled together in parallel between ground and the output, including
 one or more time varying linear equivalent output capacitors,
 one or more time varying linear equivalent output resistors, and
 one or more time varying linear equivalent output current sources.

13. The method of claim 12, wherein
the time varying linear output model further includes
 one or more input waveform parameterized linear current sources coupled in parallel to the one or more time varying linear equivalent output capacitors, resistors, and current sources, the one or more input waveform parameterized linear current sources responsive to the input waveform applied to the input of the non-linear logic gate.

14. The method of claim 13, wherein
the time varying linear output model further includes
 one or more parameterized time varying linear equivalent output capacitors coupled in parallel to the one or more time varying linear equivalent output capacitors, resistors, and current sources;
 one or more parameterized time varying linear equivalent output resistors coupled in parallel to the one or more time varying linear equivalent output capacitors, resistors, and current sources; and
 one or more parameterized time varying linear equivalent output current sources coupled in parallel to the one or more time varying linear equivalent output capacitors, resistors, and current sources.

15. The method of claim 12, wherein
the time varying linear gate model further includes a time varying linear input model representing the input of the non-linear logic gate, the time varying linear input model has linear circuit elements coupled together in parallel between ground and the input, including
 one or more time varying linear equivalent input capacitors,
 one or more time varying linear equivalent input resistors, and
 one or more time varying linear equivalent input current sources.

16. The method of claim 15, wherein
the time varying linear input model further includes
- one or more input waveform parameterized linear current sources coupled in parallel to the one or more time varying linear equivalent input capacitors, resistors, and current sources.

17. The method of claim 15, wherein
the time varying linear input model further includes
- one or more parameterized time varying linear equivalent input capacitors coupled in parallel to the one or more time varying linear equivalent input capacitors, resistors, and current sources;
- one or more parameterized time varying linear equivalent input resistors coupled in parallel to the one or more time varying linear equivalent input capacitors, resistors, and current sources; and
- one or more parameterized time varying linear equivalent input current sources coupled in parallel to the one or more time varying linear equivalent input capacitors, resistors, and current sources.

18. The method of claim 1, wherein
each equivalent current source equation representing each equivalent current source has an inverse matrix term including frequency as a variable.

19. The method of claim 18, wherein
the inverse matrix term is expressed as an Nth-order Taylor series expansion with respect to frequency.

\* \* \* \* \*